US009252167B2

United States Patent
Ye et al.

(10) Patent No.: US 9,252,167 B2
(45) Date of Patent: Feb. 2, 2016

(54) ACTIVE DEVICE ARRAY SUBSTRATE

(71) Applicant: AU Optronics Corporation, Hsin-Chu (TW)

(72) Inventors: Jia-Hong Ye, Hsin-Chu (TW); Ssu-Hui Lu, Hsin-Chu (TW); Wu-Hsiung Lin, Hsin-Chu (TW); Chao-Chien Chiu, Hsin-Chu (TW); Ming-Hsien Lee, Hsin-Chu (TW); Chia-Tien Peng, Hsin-Chu (TW); Wei-Ming Huang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 14/486,069

(22) Filed: Sep. 15, 2014

(65) Prior Publication Data
US 2015/0028336 A1  Jan. 29, 2015

Related U.S. Application Data

(62) Division of application No. 13/625,949, filed on Sep. 25, 2012, now Pat. No. 8,865,532.

(51) Int. Cl.
*H01L 27/12* (2006.01)
*H01L 29/786* (2006.01)

(52) U.S. Cl.
CPC ........ *H01L 27/1255* (2013.01); *H01L 27/1218* (2013.01); *H01L 27/1248* (2013.01); *H01L 29/78603* (2013.01)

(58) Field of Classification Search
CPC ............ H01L 27/1255; H01L 27/1218; H01L 27/1248; H01L 29/78603
See application file for complete search history.

(56) References Cited

U.S. PATENT DOCUMENTS

| 6,355,945 | B1 | 3/2002 | Kadota et al. |
| 6,515,336 | B1* | 2/2003 | Suzawa et al. ................ 257/350 |
| 6,788,357 | B2 | 9/2004 | Moon |
| 7,279,370 | B2 | 10/2007 | Lim et al. |
| 7,428,032 | B2 | 9/2008 | Yoo et al. |
| 7,495,721 | B2 | 2/2009 | Elrod |
| 7,741,643 | B2 | 6/2010 | Miyazaki et al. |
| 2004/0106240 | A1* | 6/2004 | Peng et al. .................... 438/166 |

(Continued)

FOREIGN PATENT DOCUMENTS

| CN | 101271905 | 9/2008 |
| TW | 200743210 | 11/2007 |
| TW | 201119110 | 6/2011 |

*Primary Examiner* — Anthony Ho
*Assistant Examiner* — Samuel Lair
(74) *Attorney, Agent, or Firm* — WPAT, PC; Justin King

(57) ABSTRACT

An active device array substrate includes a flexible substrate, a gate electrode, a dielectric layer, a channel layer, a source electrode, a drain electrode, and a pixel electrode. The flexible substrate has a transistor region and a transparent region adjacent to each other. The gate electrode is disposed on the transistor region. The dielectric layer covers the flexible substrate and the gate electrode. A portion of the dielectric layer disposed on the gate electrode has a first thickness. Another portion of the dielectric layer disposed on the transparent region has a second thickness less than the first thickness. The channel layer is disposed above the gate electrode. The source electrode and the drain electrode are electrically connected to the channel layer. The pixel electrode is disposed on the dielectric layer which is disposed on the transparent region. The pixel electrode is electrically connected to the drain electrode.

14 Claims, 30 Drawing Sheets

(56) References Cited

U.S. PATENT DOCUMENTS

| | | |
|---|---|---|
| 2005/0270434 A1 | 12/2005 | Jung et al. |
| 2006/0134315 A1* | 6/2006 | Elrod ............... G02B 5/208 427/8 |
| 2007/0048911 A1 | 3/2007 | Oh et al. |
| 2008/0018850 A1 | 1/2008 | Shih et al. |
| 2008/0136990 A1* | 6/2008 | Kimura ........................ 349/46 |
| 2008/0213949 A1 | 9/2008 | Tung |
| 2008/0273147 A1 | 11/2008 | Kim et al. |
| 2009/0207366 A1* | 8/2009 | Kim ............................. 349/147 |
| 2010/0149449 A1* | 6/2010 | Lee ................ G02F 1/134363 349/46 |
| 2010/0285623 A1* | 11/2010 | Shih ................... H01L 21/268 438/34 |
| 2011/0117695 A1 | 5/2011 | Cheng et al. |
| 2011/0127518 A1 | 6/2011 | Jung et al. |
| 2011/0193089 A1 | 8/2011 | Chou et al. |
| 2011/0248261 A1 | 10/2011 | Yamazaki |
| 2011/0284853 A1 | 11/2011 | Park et al. |
| 2012/0001170 A1 | 1/2012 | Yamazaki |

* cited by examiner

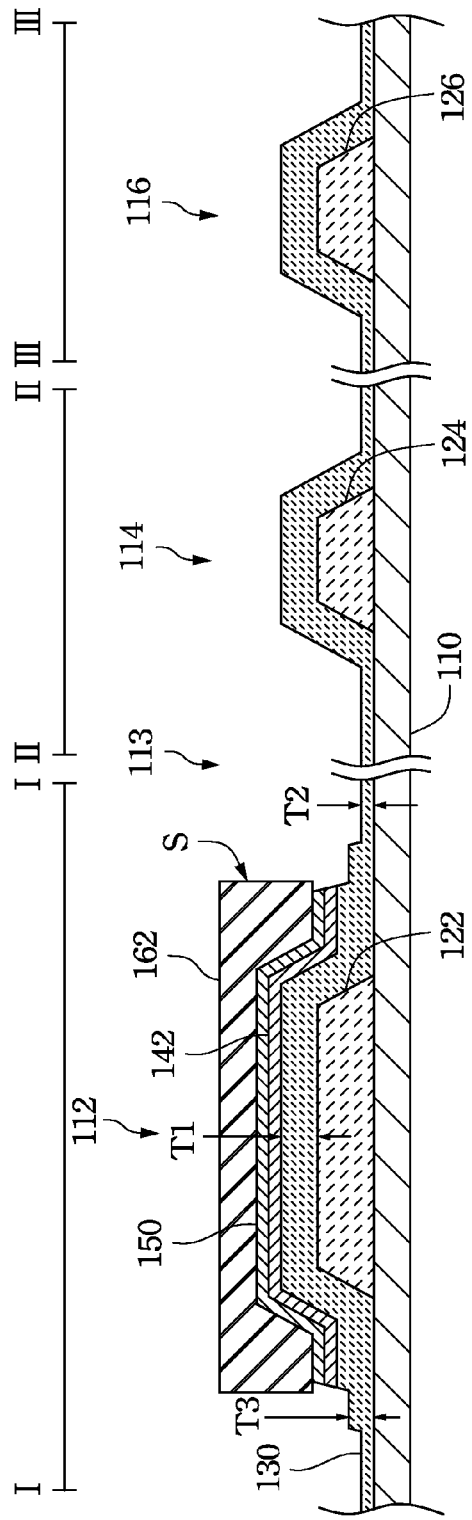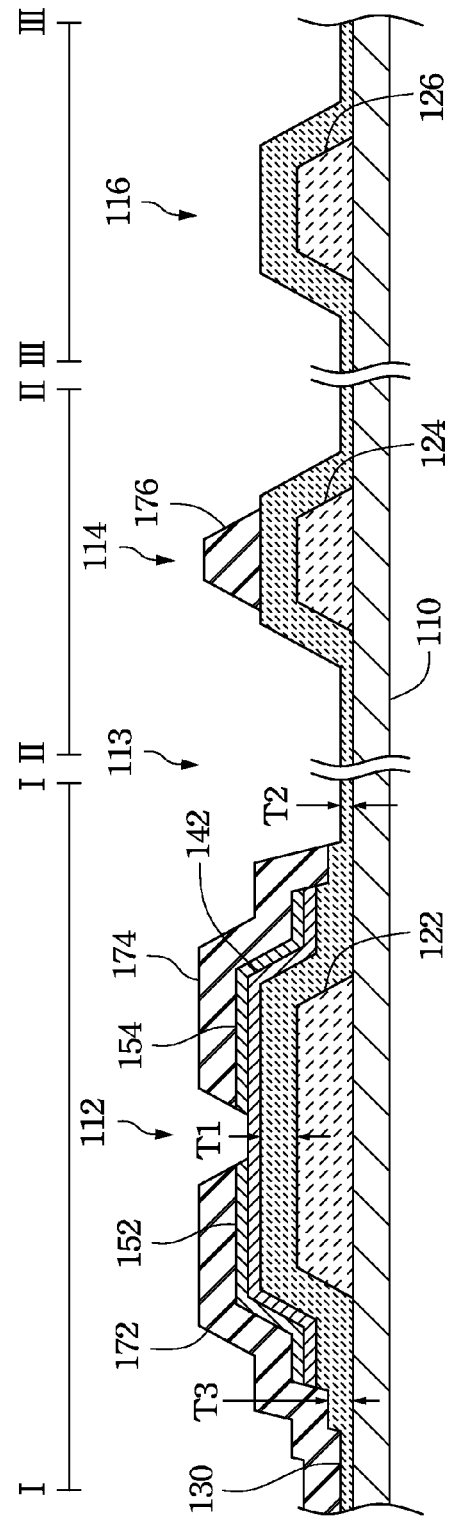

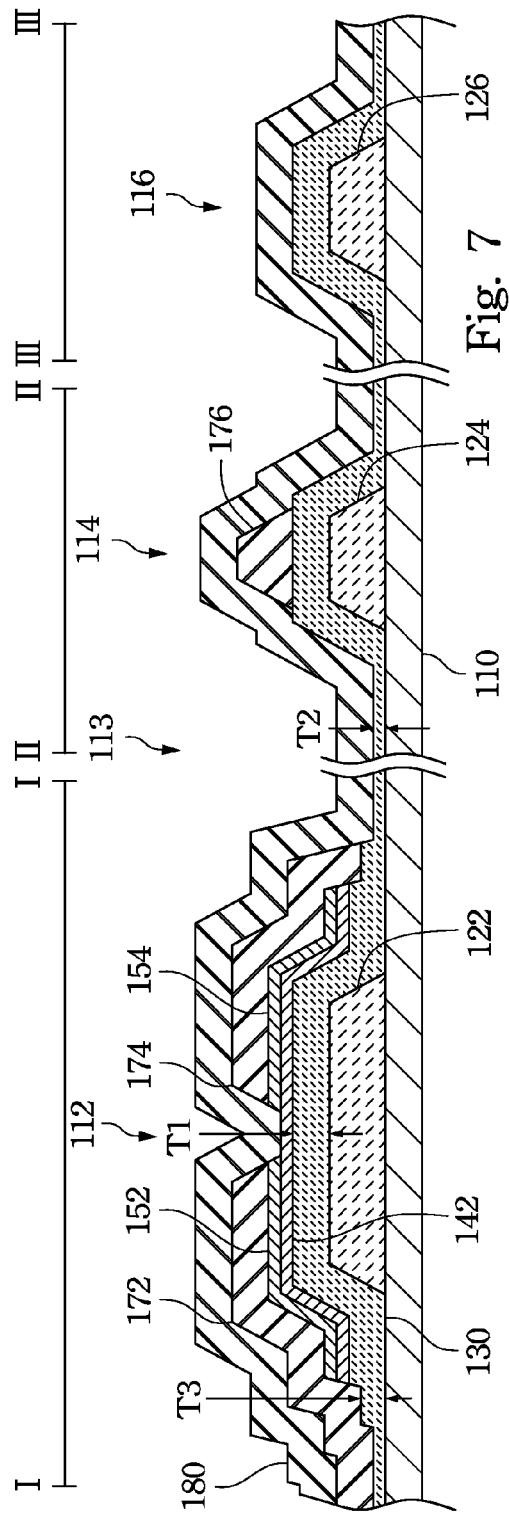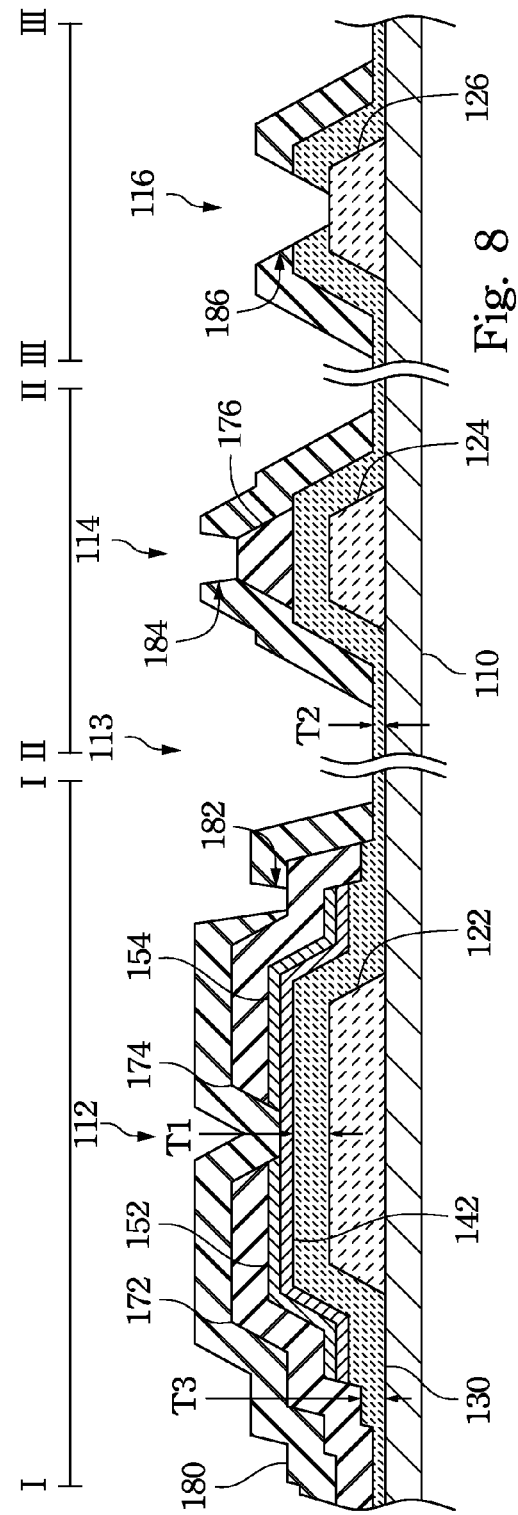

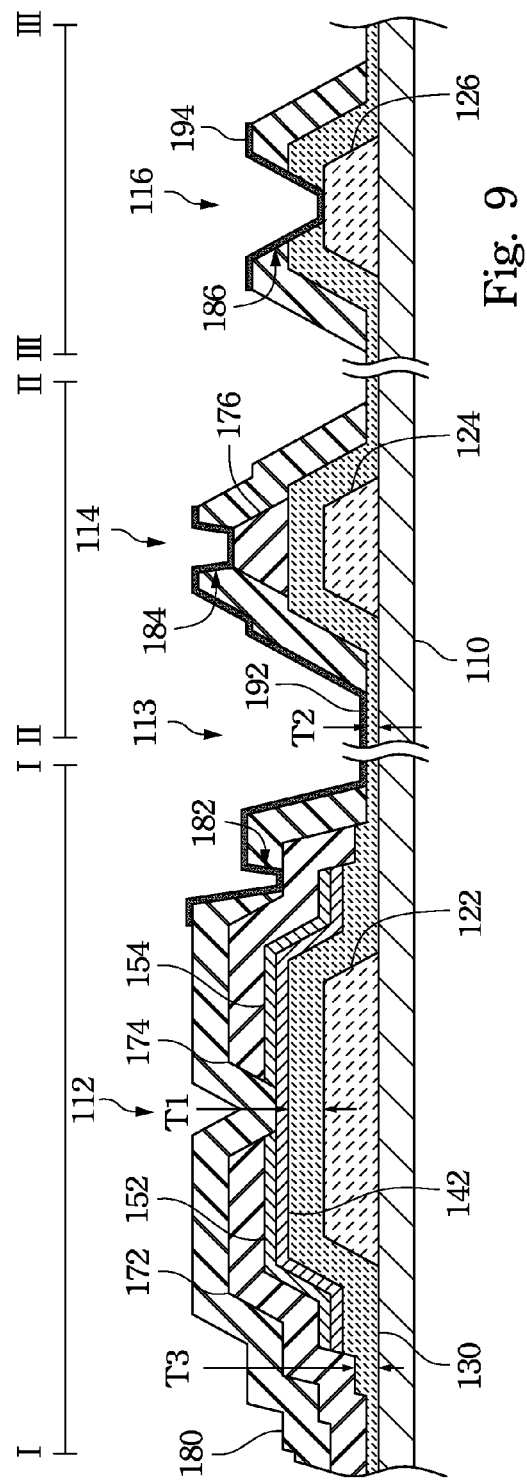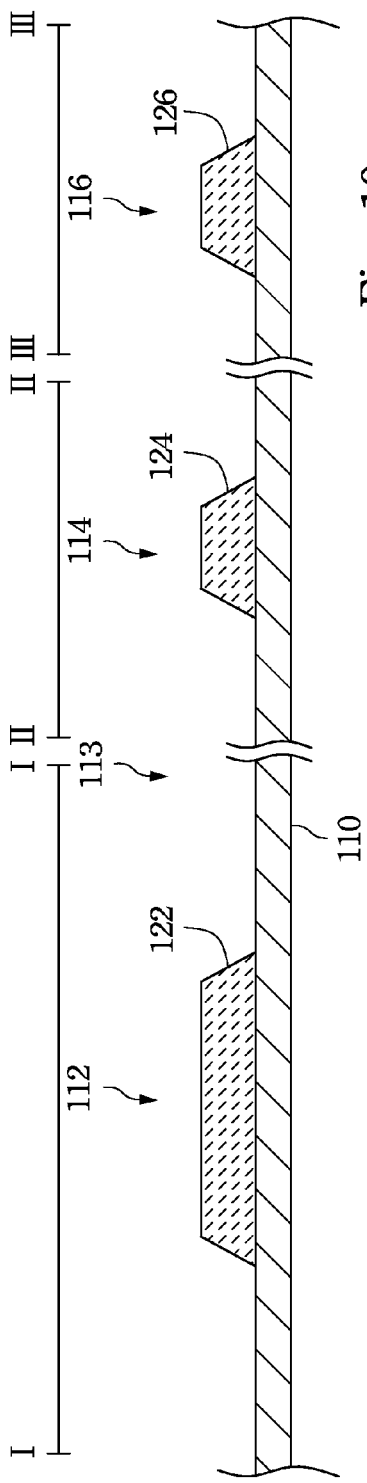

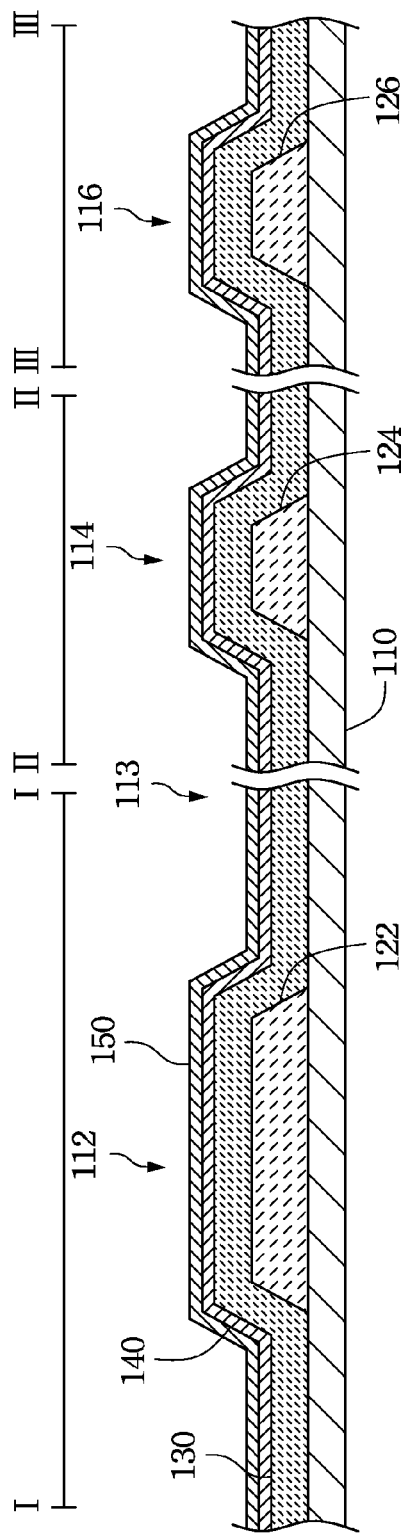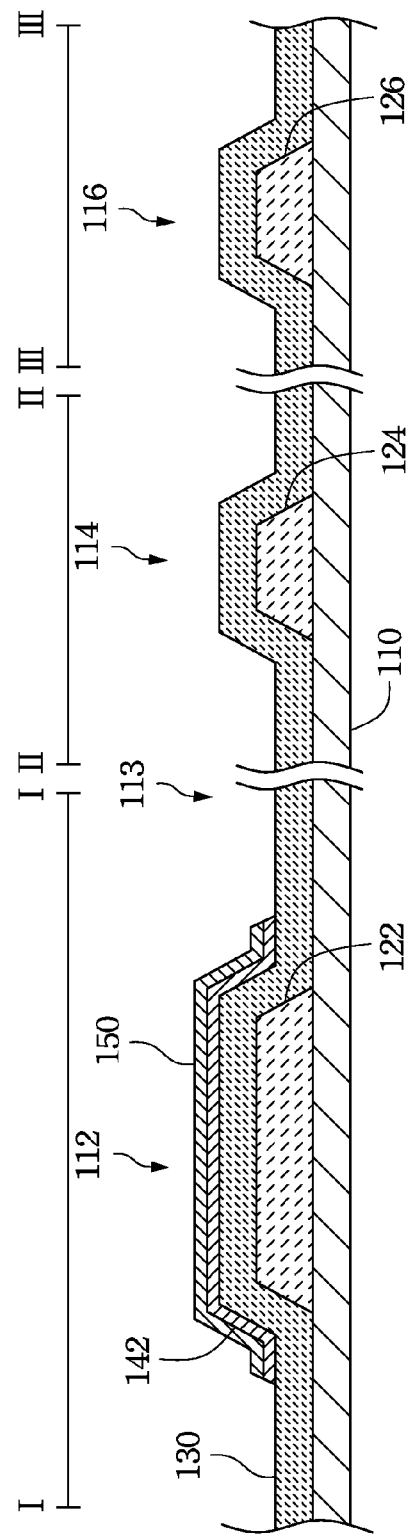

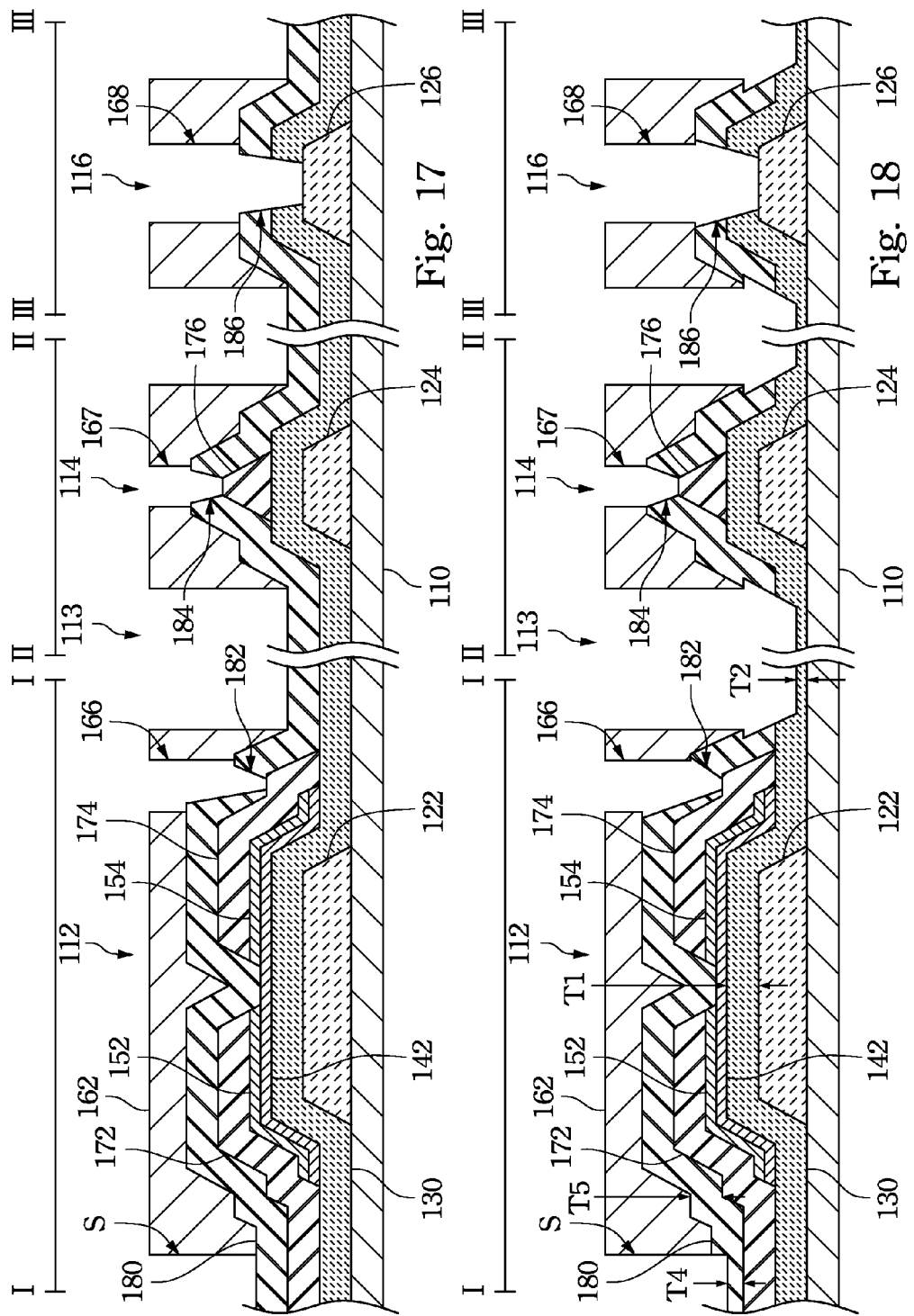

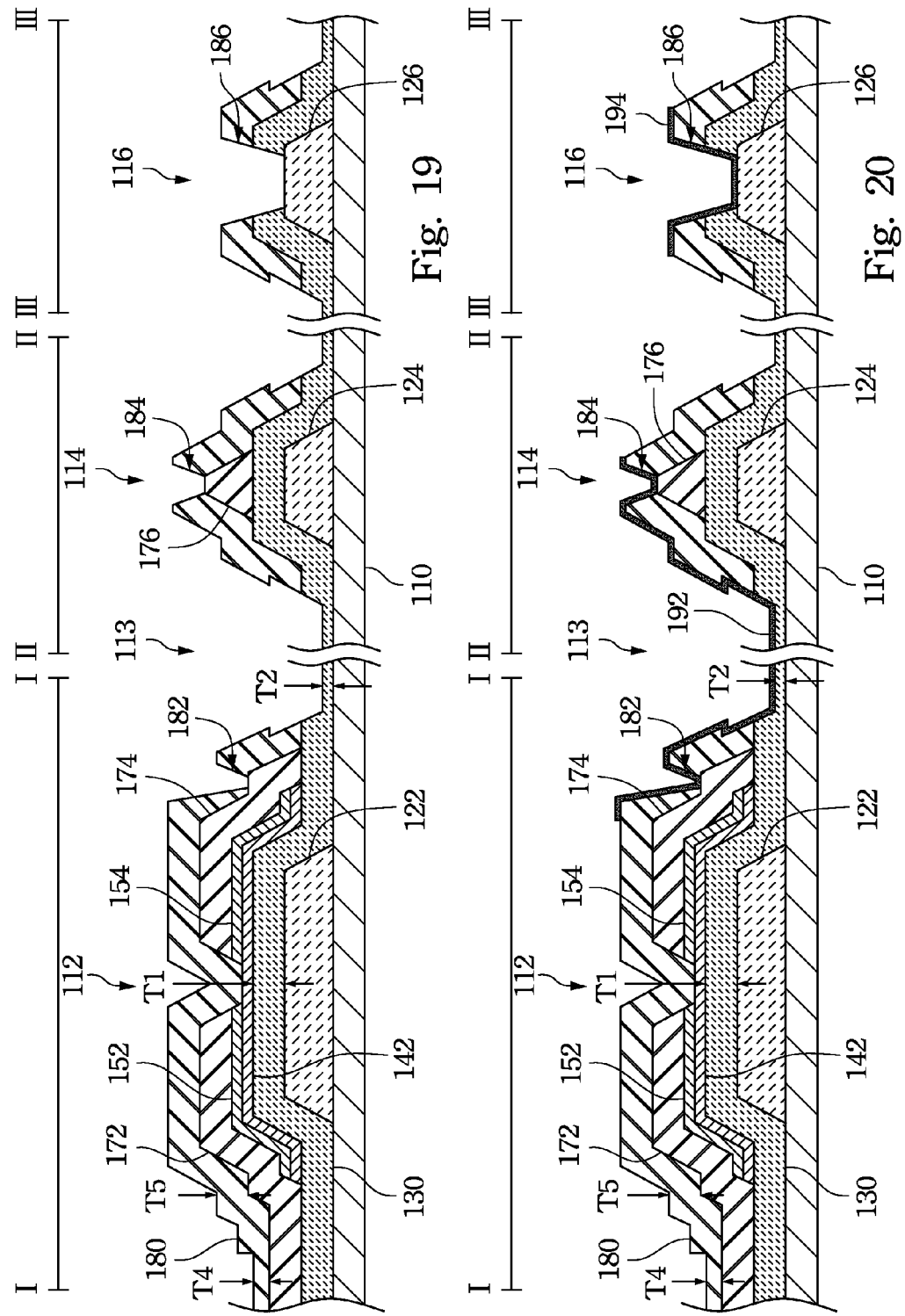

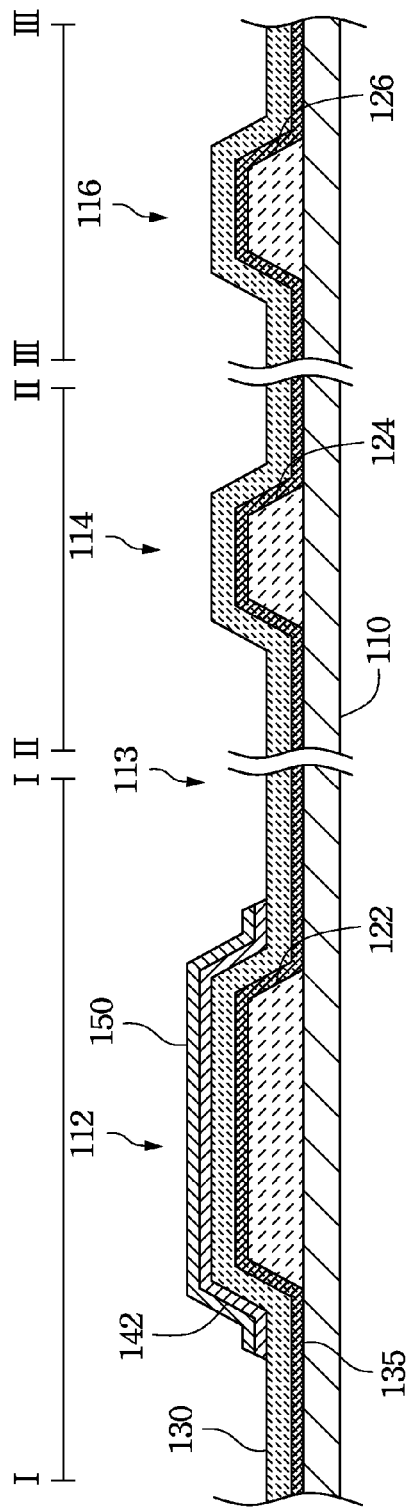
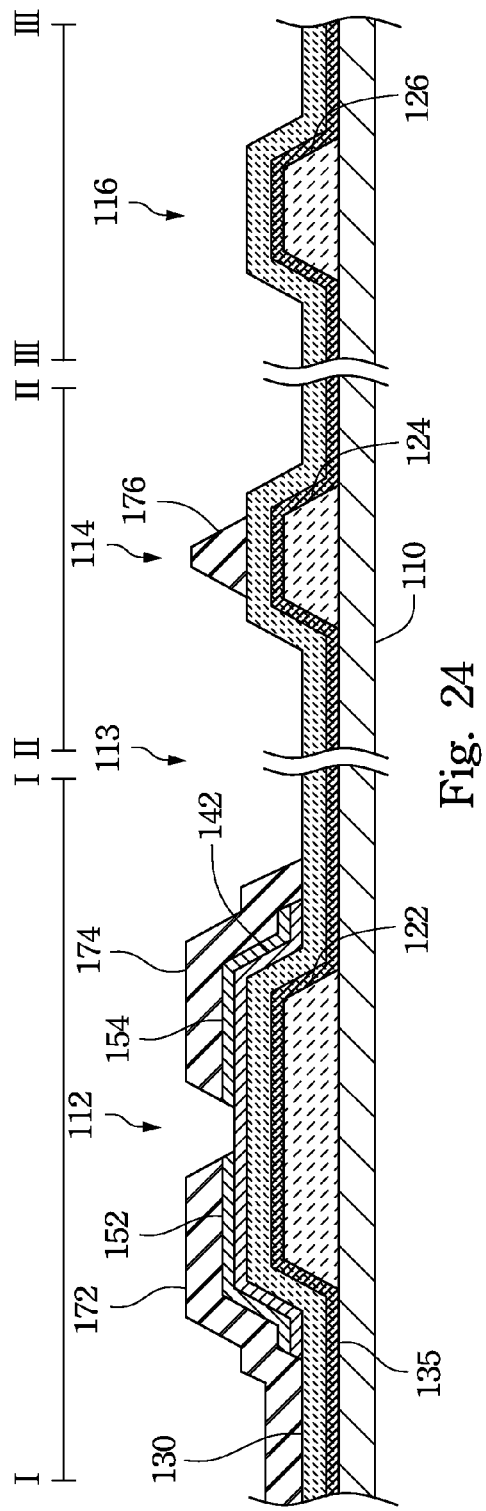
Fig. 23
Fig. 24

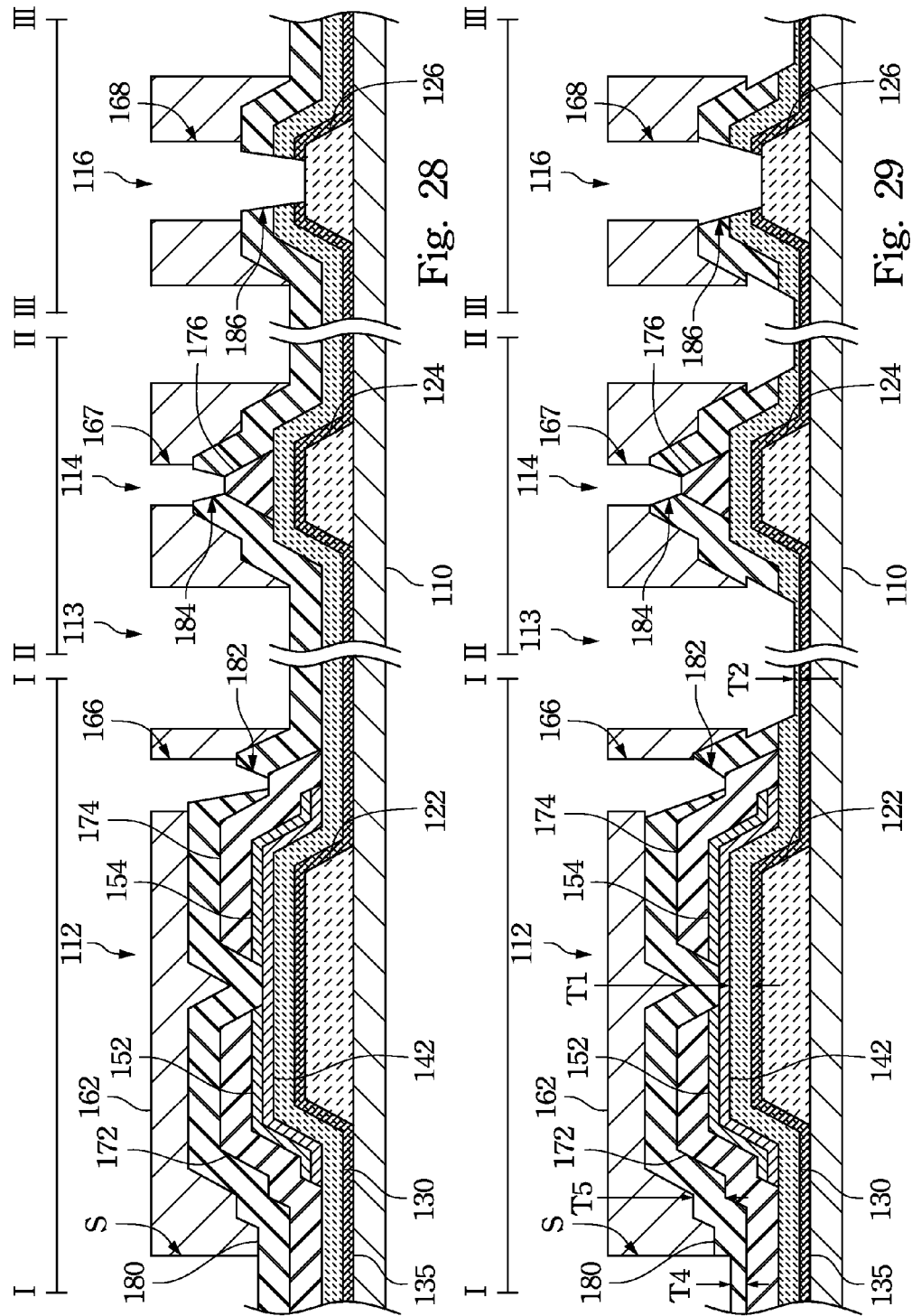

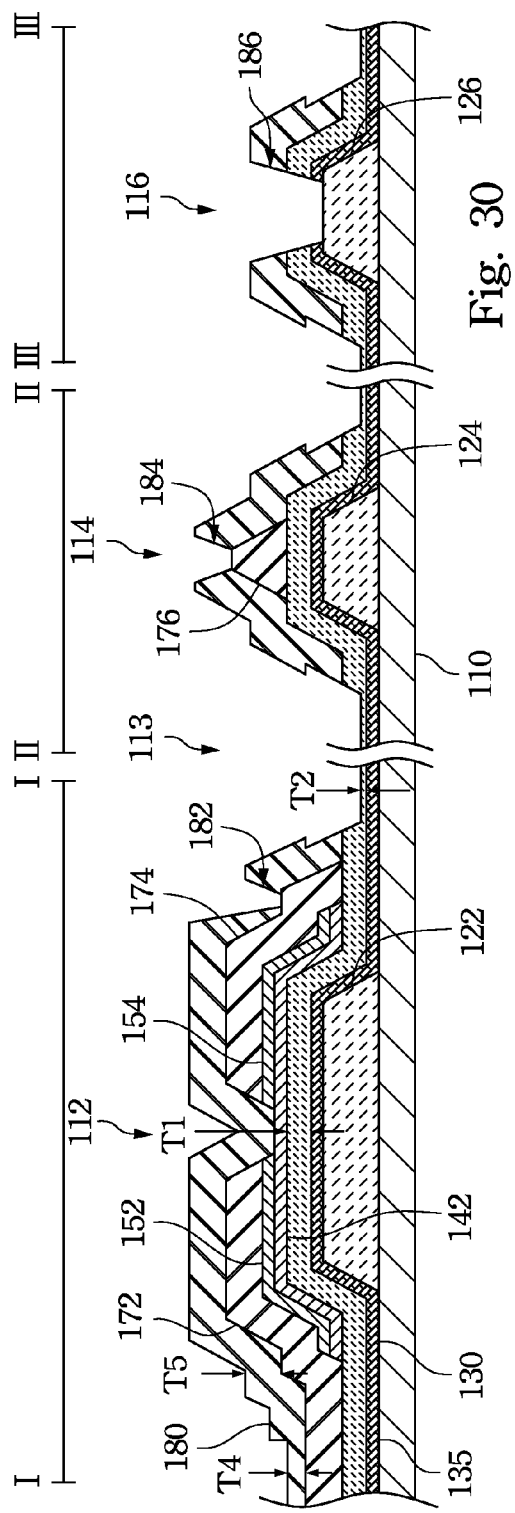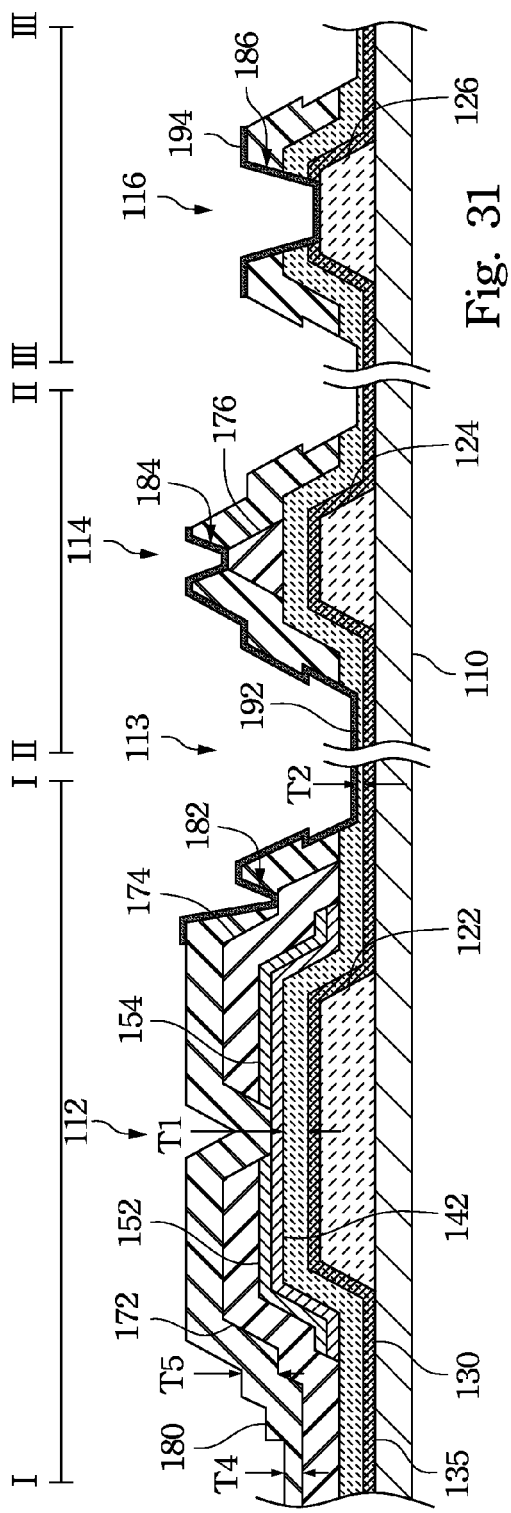

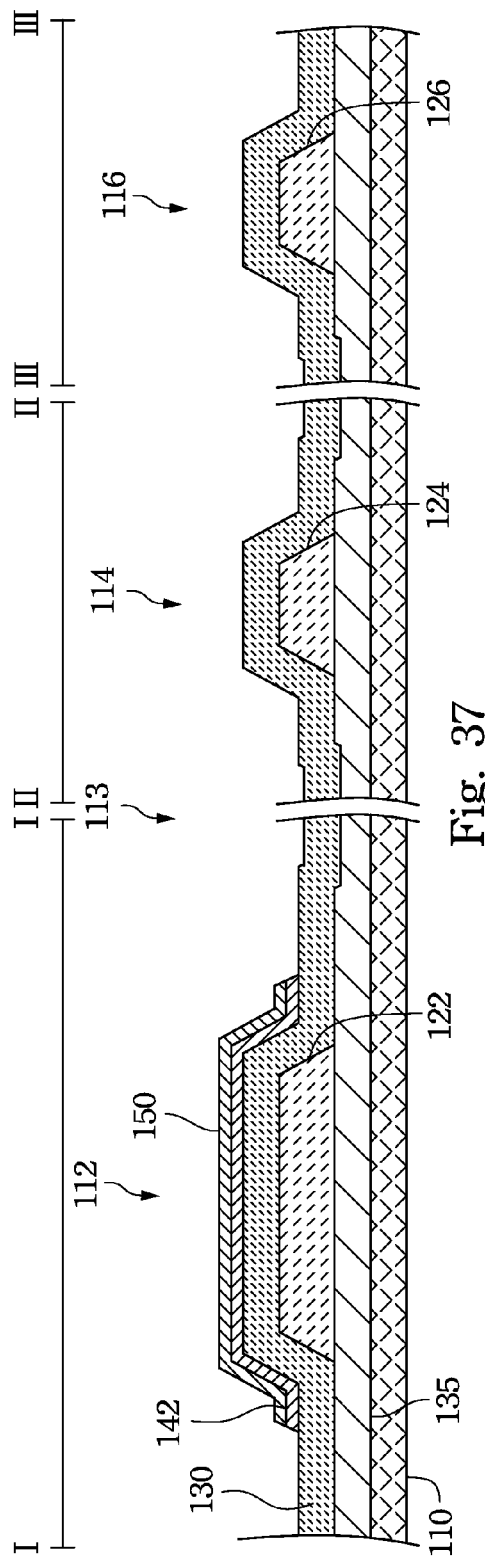
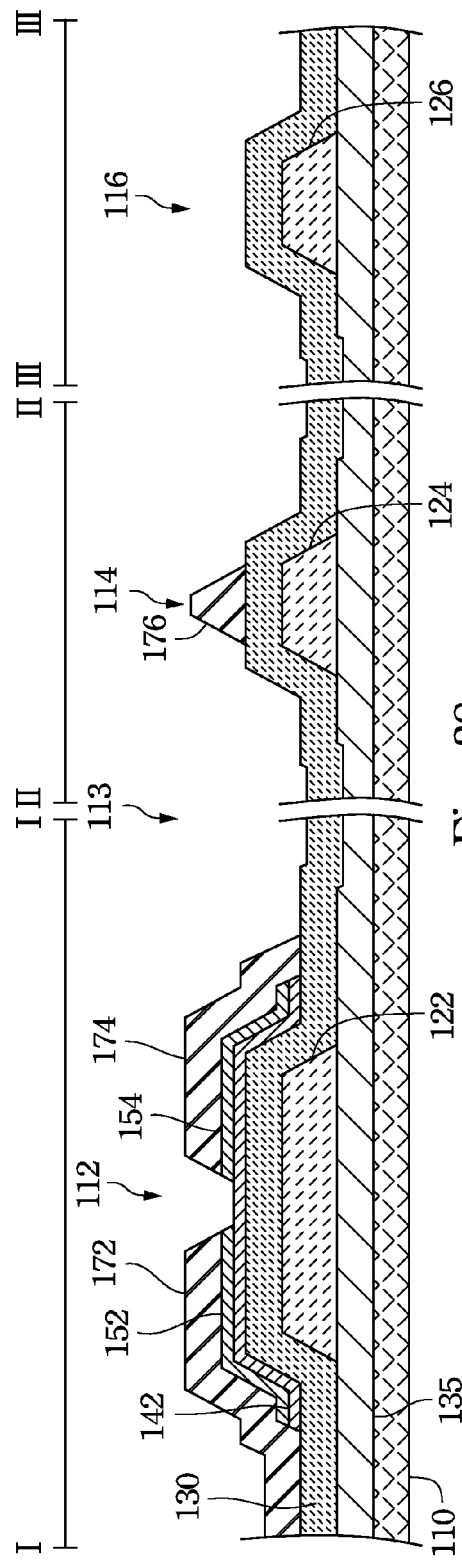

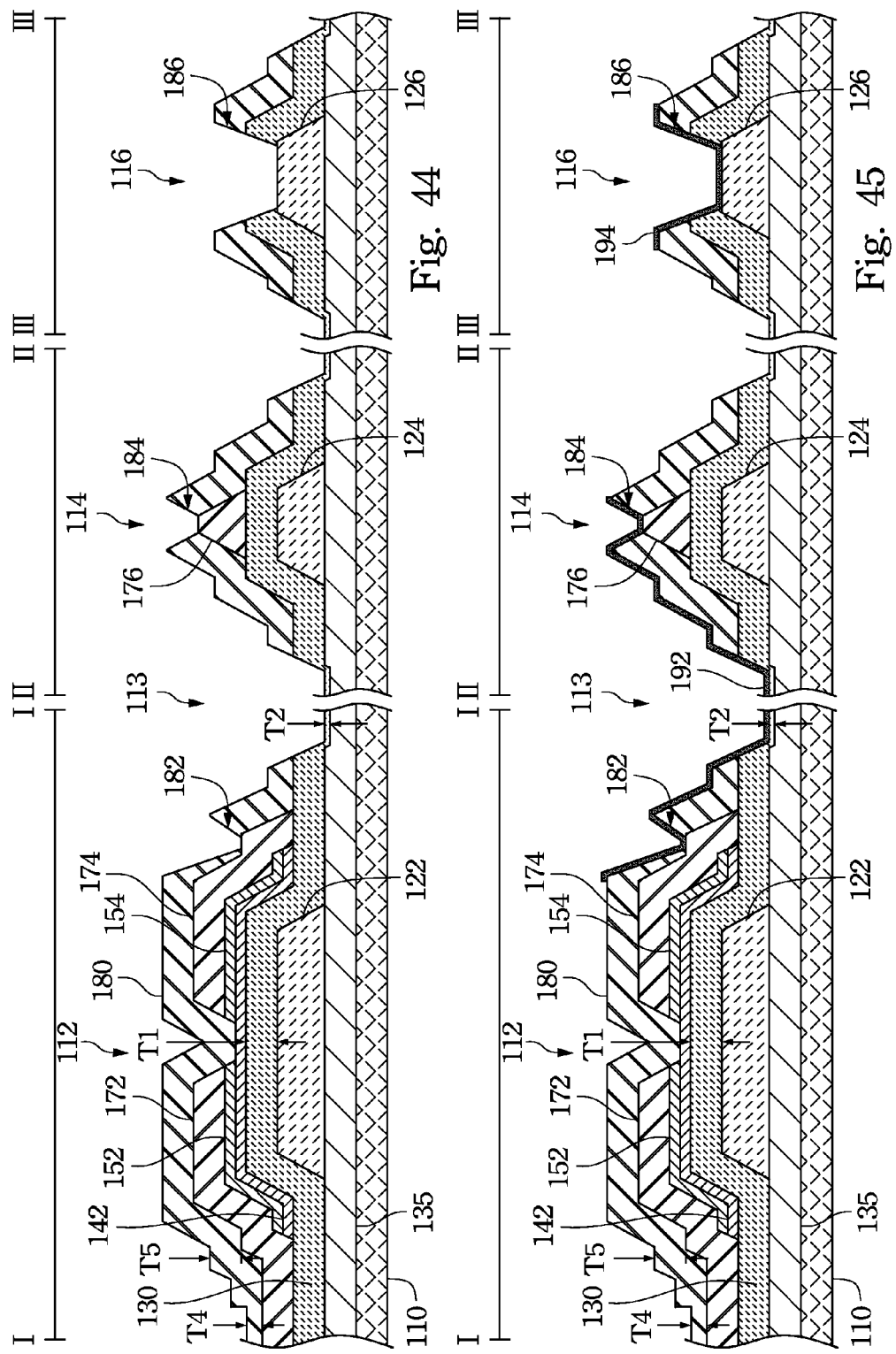

ACTIVE DEVICE ARRAY SUBSTRATE

RELATED APPLICATIONS

The present application is a divisional of U.S. application Ser. No. 13/625,949, filed on Sep. 25, 2012, which was based on, and claims priority from, Taiwan Patent Application Serial Number 100136300, filed Oct. 6, 2011, and Taiwan Patent Application Serial Number 101116043, filed May 4, 2012, the disclosure of which are hereby incorporated by reference herein in its entirely.

BACKGROUND

1. Field of Invention

The present disclosure relates to an active device array substrate with a flexible substrate.

2. Description of Related Art

Electro-phoretic displays (EPDs) were developed in 1970s. Such a first-generation EDP comprises many small charged balls that are white on one side and black on the other side. The balls rotate to show different colors under a varied electric field. Second-generation electronic paper displays were developed in the 1990s. In a second-generation EDP, microcapsules filled with colored oil and charged white particles replace the small charged balls. An external electric field controls the movement of the white particles. The display shows a white color when the white particles move upward (toward the user), while it shows the color of the oil when the white particles move downward (away from the user).

In general, an EPD is formed of an active device array with a glass substrate. Although the EPD owns higher hardness, the heavy weight that is not easy to be portable and the fragment are the problems.

Recently, the industry in the art promotes an EPD formed of active device array with plastic substrate. Since they are flexible in a certain extent, they may replace the traditional paper or the billboards. During the manufacture of the EPDs, the manufacturer needs to fix the active device array substrate on the glass substrate to adapt to the present machines since the active device array substrate is made of plastic. However, the stress may be stored within the active device array substrate and the glass substrate during the heat process since the thermal expansion coefficients of the plastic, the glass, and even the inorganic dielectric layer, such as the gate dielectrics and the passivation, on the active device array substrate exist huge differences. Therefore, it may produce the deformations of the active device array substrate and the glass substrate to occur problems such as slides crashed or weak adhesion of the slides on the machine.

SUMMARY

According to one aspect of the present invention, an active device array substrate is provided. The thickness of the dielectric layer is thinner for reducing the deformation of the active device array substrate and the glass substrate produced during the manufacturing process under a sufficient protection presupposition.

According to one embodiment of the present invention, an active device array substrate includes a flexible substrate, a gate electrode, a dielectric layer, a channel layer, a source electrode, a drain electrode, and a pixel electrode. The flexible substrate has at least one transistor region and at least one transparent region adjacent to each other. The gate electrode is disposed on the transistor region of the flexible substrate. The dielectric layer covers the gate electrode and the flexible substrate. A portion of the dielectric layer is disposed on the gate electrode and has a first thickness. Another portion of the dielectric layer is disposed on the transparent region of the flexible substrate and has a second thickness. The second thickness is less than the first thickness. The channel layer, the source electrode and the drain electrode are disposed on the dielectric layer which is disposed on the transistor region. The channel layer is disposed above the gate electrode. The source electrode and the drain electrode are disposed on opposite sides of the channel layer and are electrically connected to the channel layer. The pixel electrode is disposed on the dielectric layer which is disposed on the transparent region. The pixel electrode is electrically connected to the drain electrode.

In one or more embodiment of the present invention, the material of the flexible substrate optionally includes plastic.

In one or more embodiment of the present invention, the material of the flexible substrate optionally includes polyimide (PI), polyethylene terephthalate (PET), polyethylene naphthalate (PEN), or any combination thereof.

In one or more embodiment of the present invention, the material of the dielectric layer optionally includes silicon nitride ($SiN_x$), silicon oxide ($SiO_2$), silicon oxynitride ($SiO_xN_y$), or any combination thereof.

In one or more embodiment of the present invention, the active device array substrate optionally includes at least one storage capacitor disposed on the flexible substrate. The storage capacitor includes a bottom electrode, a capacitor dielectric layer, and a top electrode.

In one or more embodiment of the present invention, the capacitor dielectric layer optionally is a part of the dielectric layer.

In one or more embodiment of the present invention, the active device array substrate optionally includes at least one bonding pad disposed on the flexible substrate. The bonding pad optionally includes a bottom bonding pad and a top bonding pad.

In one or more embodiment of the present invention, the material of the channel layer optionally includes amorphous silicon, poly-silicon, oxide semiconductor, or any combination thereof.

In one or more embodiment of the present invention, the active device array substrate optionally includes a passivation layer covering the channel layer, the source electrode, and the drain electrode.

In one or more embodiment of the present invention, the material of the pixel electrode optionally includes indium tin oxide, indium zinc oxide, aluminum zinc oxide, or any combination thereof.

In one or more embodiment of the present invention, the active device array substrate optionally includes a metal oxide dielectric layer disposed between the flexible substrate and the dielectric layer.

In one or more embodiment of the present invention, the metal oxide dielectric layer is optionally further disposed between the flexible substrate and the gate electrode.

In one or more embodiment of the present invention, the metal oxide dielectric layer is optionally further disposed between the dielectric layer and the gate electrode.

In one or more embodiment of the present invention, the material of the metal oxide dielectric layer optionally includes indium oxide, zinc oxide, gallium oxide, or any combination thereof.

BRIEF DESCRIPTION OF THE DRAWINGS

FIG. 1 to FIG. 9 are cross-sectional views of a method for manufacturing an active device array substrate according to the first embodiment of the present invention;

FIG. 10 to FIG. 20 are cross-sectional views of a method for manufacturing an active device array substrate according to the second embodiment of the present invention;

FIG. 21 to FIG. 31 are cross-sectional views of a method for manufacturing an active device array substrate according to the third embodiment of the present invention;

FIG. 32 to FIG. 45 are cross-sectional views of a method for manufacturing an active device array substrate according to the fourth embodiment of the present invention.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

The First Embodiment

Figure 46:
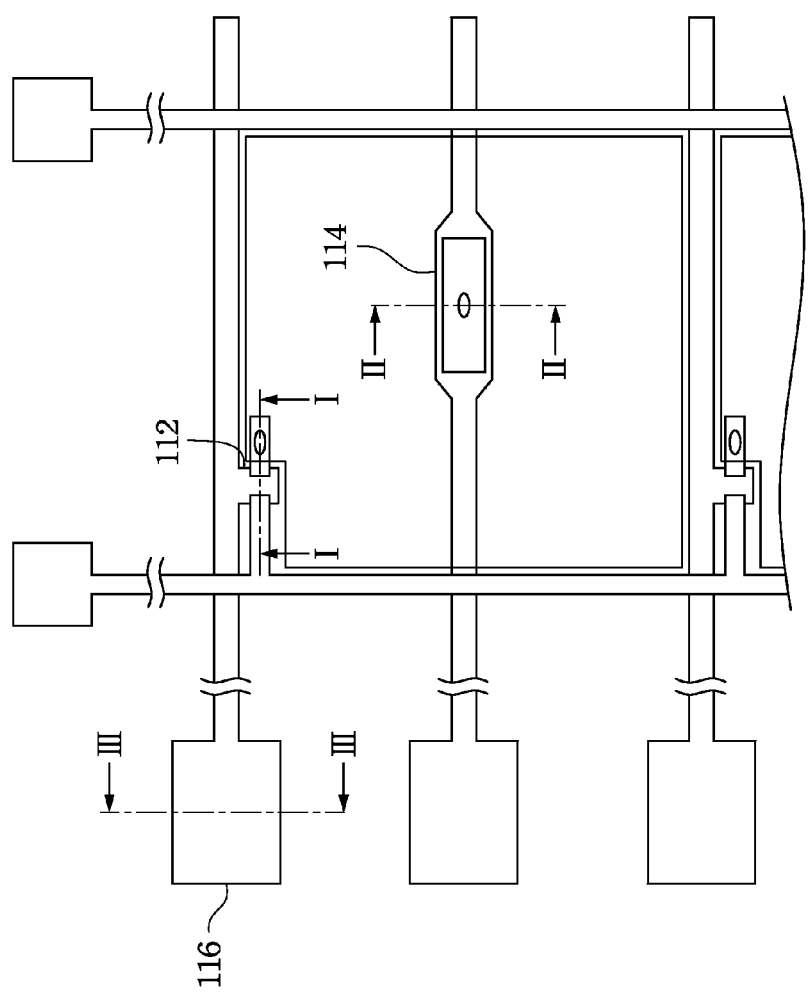
FIG. 46 is a top view of the active device array substrate according to the first, the second, the third, and the fourth embodiments of the present invention.

FIG. 1 to FIG. 9 are cross-sectional views of a method for manufacturing an active device array substrate according to the first embodiment of the present invention. FIG. 46 is a top view of the active device array substrate according to the first, the second, the third, and the fourth embodiments of the present invention. As shown in FIG. 1 to FIG. 9, the area I-I represents the cross-section taken along the line I-I of FIG. 46, the area II-II represents the cross-section taken along the line II-II of FIG. 46, and the area III-III represents the cross-section taken along the line III-III of FIG. 46. The top view design of the active device array substrate shown in FIG. 46 is illustrative only and should not limit the scope of the claimed invention. The person having ordinary skill in the art may modify the top view design of the active device array substrate according to actual requirements.

Figure 1:
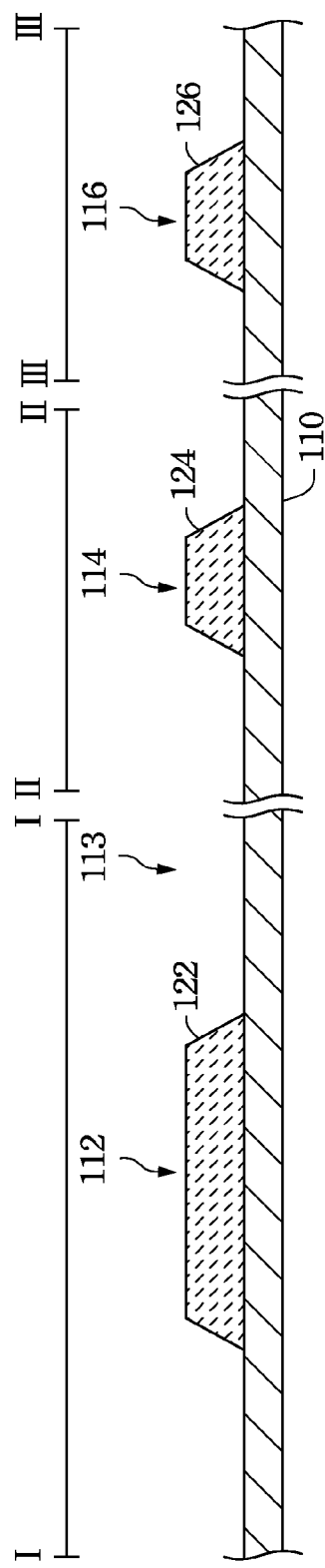

As shown in FIG. 1, a manufacturer may provide a flexible substrate 110 first. The flexible substrate 110 can be flexible, such that the display panel manufactured by the following processes is also flexible. The flexible substrate 110 has a transistor region 112, a transparent region 113, a capacitor region 114, and a bonding pad region 116 adjacent to each other. In one or more embodiments of the present invention, the manufacturer may dispose the flexible substrate 110 on a glass substrate to proceed the following processes for convenience. The flexible substrate 110 may be stripped from the glass substrate after the method for manufacturing the active device array substrate is finished. In the present embodiment, the material of the flexible substrate 110 may include plastic, such as polyimide (PI), polyethylene terephthalate (PET), polyethylene naphthalate (PEN), other copolymers, or any combination thereof. It should be understood that the material of the flexible substrate 110 is illustrative only and should not limit the scope of the claimed invention. The person having ordinary skill in the art may select a proper material for the flexible substrate 110 according to actual requirements.

Then, the manufacturer may form a patterned first conductive layer on the flexible substrate 110. For example, the manufacturer may form a first conductive layer first and then pattern the first conductive layer by photolithography and etching processes to form the patterned first conductive layer on the flexible substrate 110. The patterned first conductive layer includes at least a gate electrode 122 on the transistor region 112 of the flexible substrate 110. In other words, the gate electrode 122 can be disposed directly or indirectly on the flexible substrate 110. The patterned first conductive layer further includes gate lines connected to the gate electrode 122, a bottom electrode 124 formed on the capacitor region 114 of the flexible substrate 110, and a bottom bonding pad 126 formed on the bonding pad region 116 of the flexible substrate 110. In the present embodiment, the material of the first conductive layer, i.e. the gate electrode 122, the bottom electrode 124, and the bottom bonding pad 126, may includes titanium, molybdenum, chromium, iridium, aluminum, copper, silver, gold or any combination or alloy thereof. The first conductive layer may be formed by a physical vapor deposition process, such as a sputtering deposition process, or a chemical vapor deposition process. The first conductive layer may be patterned by the photolithography and etching processes.

Figure 2:
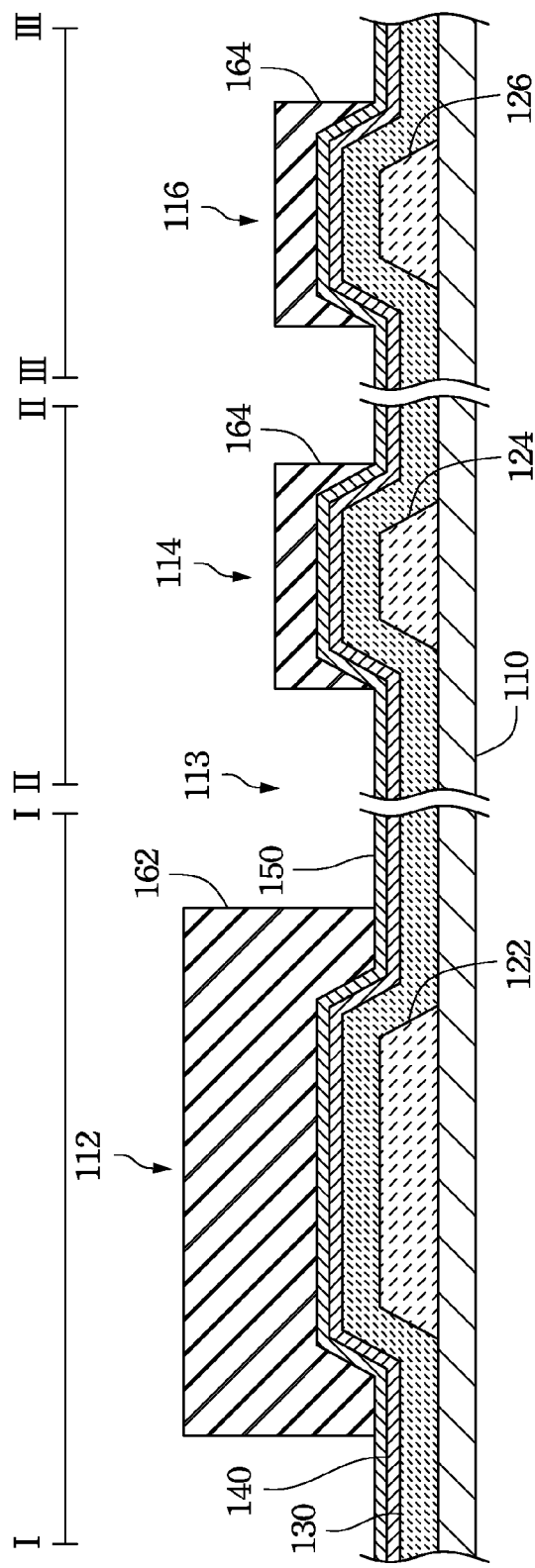

Reference is made to FIG. 2. The manufacturer may sequentially form a dielectric layer 130, a semiconductor layer 140, and an ohmic contact layer 150. The dielectric layer 130, the semiconductor layer 140, and the ohmic contact layer 150 cover the gate electrode 122, the bottom electrode 124, the bottom bonding pad 126, and the flexible substrate 110. The material of the dielectric layer 130 may include silicon nitride ($SiN_x$), silicon oxide ($SiO_2$), silicon oxynitride ($SiO_xN_y$), or any combination thereof. The material of the semiconductor layer 140 may include amorphous silicon, poly-silicon, oxide semiconductor, or any combination thereof. The material of the ohmic contact layer 150 may include n-doped amorphous silicon, p-doped amorphous silicon and/or so on.

Then, the manufacturer may form a mask layer on the ohmic contact layer 150. The mask layer covers the ohmic contact layer 150 and the semiconductor layer 140 beneath the ohmic contact layer 150. Then, the manufacturer may pattern the mask layer to form a patterned mask layer by a half-tone mask process. The patterned mask layer may include at least one thick mask layer 162 and a plurality of thin mask layers 164. The thick mask layer 162 is disposed above the transistor region 112 of the flexible substrate 110, and the thin mask layers 164 are respectively disposed above the capacitor region 113 and the bonding pad region 116 of the flexible substrate 110. On the other hand, the patterned mask layer is not disposed above the transparent region 113 of the flexible substrate 110.

Figure 3:
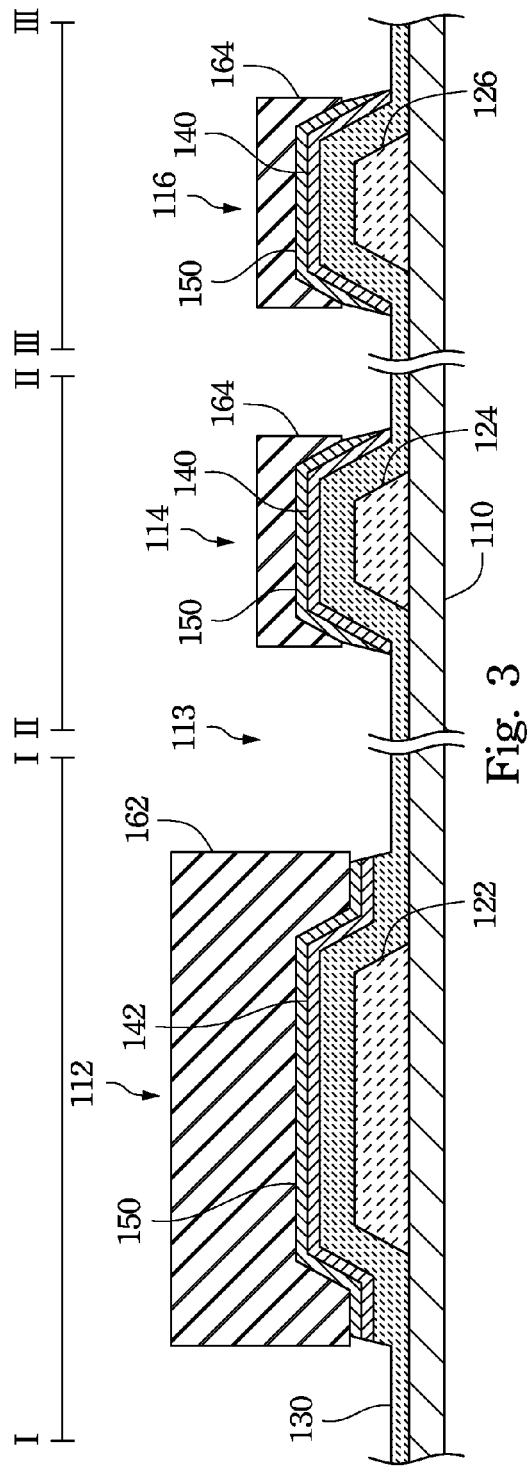

Reference is made to FIG. 3. The manufacturer may remove a part of the semiconductor layer 140, a part of the ohmic contact layer 150, and a thickness of a part of the dielectric layer 130 which are exposed by the patterned mask layer (including the thick mask layers 162 and the thin mask layers 164), wherein the exposed parts of the semiconductor layer 140, the ohmic contact layer 150, and the dielectric layer 130 are on and/or above the transparent region 113 of the flexible substrate 110. In the present embodiment, the exposed parts of the semiconductor layer 140 and the ohmic contact layer 150 and the thickness of the exposed part of the dielectric layer 130 may be removed by, for example, dry etching or wet etching.

Figure 4:
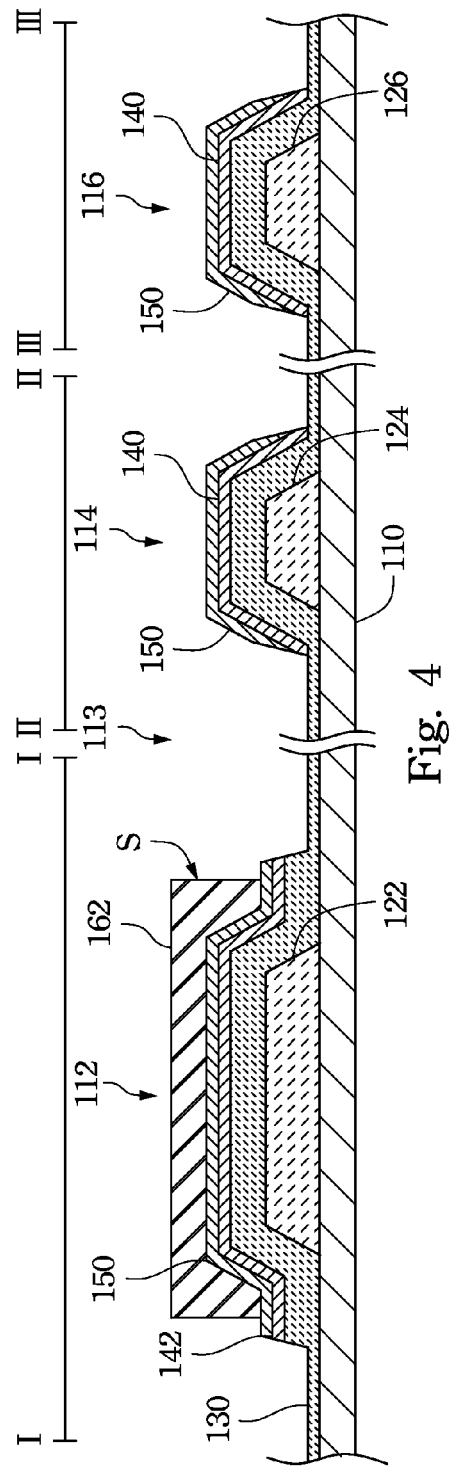

Reference is made to FIG. 4. The manufacturer may remove a part of the patterned mask layer which is disposed above the bottom electrode 124 and the bottom bonding pad 126. More specifically, the manufacturer may remove the thin mask layers 164 and simultaneously remove a thickness of the thick mask layer 162. In the present embodiment, the thin mask layers 164 and the thickness of the thick mask layer 162 may be removed by an ashing process.

Reference is made to FIG. 5. The manufacturer may remove a part of the dielectric layer 130 which is exposed by the remaining patterned mask layer, i.e. the thick mask layer 162 after the thickness reduction, wherein the exposed part of the dielectric layer 130 is disposed on the transparent region 113 of the flexible substrate 110, such that a portion of the dielectric layer 130 on the transparent region 113 of the flexible substrate 110 has a second thickness T2. At the same time, parts of the semiconductor layer 140 and the ohmic contact layer 150 above the bottom electrode 124 and the bottom bonding pad 126 are removed as well. In the present embodiment, the semiconductor layer 140, the ohmic contact layer 150, and the dielectric layer 130 may be removed by, for example, dry etching or wet etching. Furthermore, the manufacturer may remove the remaining patterned mask layer, i.e. the thick mask layer 162 after the thickness reduction, by a stripper after the foregoing steps.

In the present embodiment, a two-step etching process is performed to the portion of dielectric layer 130 which is disposed above the transparent region 113. During the first step shown in FIG. 3, the thickness of the portion of the dielectric layer 130 on the transparent region 113 is reduced first. Then, during the second step shown in FIG. 5, the thickness of the portion of the dielectric layer 130 on the transparent region 113 is further reduced to the second thickness T2 since the portion of the dielectric layer 130 on the transparent region 113 of the flexible substrate 110 is etched when the semiconductor layer 140 and the ohmic connect layer 150 is etched.

It should be understood that although the half-tone mask process is used in the steps shown in FIG. 2 to FIG. 5 in the present embodiment for reducing the number of masks, this should not limit the scope of the claimed invention. The person having ordinary skill in the art may reduce the thickness of the portion of the dielectric layer 130 on the transparent region 113 of the flexible substrate 110 by a mask process and remove the parts of the semiconductor layer 140 and the ohmic contact layer 150 above the bottom electrode 124 and the bottom bonding pad 126 by another mask process if necessary.

After the step shown in FIG. 5, a channel layer 142 is formed on the gate electrode 122, wherein the channel layer 142 is a part of the semiconductor layer 140, the portion of the dielectric layer 130 on the transparent region 113 of the flexible substrate 110 has the second thickness T2, and another portion of the dielectric layer 130 on the gate electrode 122 has a first thickness T1. The second thickness T2 is less than the first thickness T1. The ratio of the second thickness T2 to the first thickness T1 is 0.05-0.95, preferably 0.1-0.8, more preferably 0.3-0.6. Furthermore, a part of the dielectric layer 130 above the transistor region 112 of the flexible substrate 110 may be hurt in the etching process since it is unavoidable that ashing the thick mask layer 162 and the thin mask layers 164 may cause the thick mask layer 162 shrink as indicated by the arrow S of FIG. 4. Therefore, the part of the dielectric layer 130 above the edge of the transistor region 112 of the flexible substrate 110 has a third thickness T3, and the third thickness T3 is less than a thickness of a part of the dielectric layer 130 on the center of the transistor region 112 of the flexible substrate 110, e.g. the first thickness T1. Moreover, a metal oxide dielectric layer may be hurt in the etching process if the metal oxide dielectric layer is disposed on or above the flexible substrate 110. Therefore, the thickness of the metal oxide dielectric layer may vary.

Reference is made to FIG. 6. The manufacturer may form a source electrode 172 and a drain electrode 174 above opposite sides of the channel layer 142 and form data lines and a top electrode 176 on and/or above the dielectric layer 130. The top electrode 176 is disposed above the bottom electrode 124. The source electrode 172 and the drain electrode 174 are electrically connected to the channel layer 142. More specifically, the manufacturer may form a second conductive layer above the flexible substrate 110, and the second conductive layer covers all the structures on the flexible substrate 110. Then, the manufacturer may pattern the second conductive layer to form the source electrode 172 and the drain electrode 174 above the opposite sides of the channel layer 142 and form the top electrode 176 on the dielectric layer 130 and above the bottom electrode 124. The manufacturer may etch a part of the ohmic contact layer 150 between the source electrode 172 and the drain electrode 174 when patterning the second conductive layer, such that the ohmic contact layer 150 is divided to a source ohmic contact layer 152 and a drain ohmic contact layer 154. The foregoing embodiment is illustrated in the case that portions of the channel layer 142 are covered by the source electrode 172 and the drain electrode 174. However, in one or more embodiments, the channel layer 142 may cover portions of the source electrode 172 and the drain electrode 174 by modifying the sequences of the manufacturing steps and defining the patterns by two masks respectively. Since this is well known in the art, the details are not illustrated hereinafter.

In the present embodiment, the material of the second conductive layer, i.e. the source electrode 172, the drain electrode 174, and the top electrode 176, may include titanium, molybdenum, chromium, iridium, aluminum, copper, silver, gold, or any combination or alloy thereof. The second conductive layer may be formed by a physical vapor deposition process, such as a sputtering deposition process, or a chemical vapor deposition process. The second conductive layer may be patterned by photolithography and etching processes.

After the step shown in FIG. 6, the gate electrode 122, the portion of the dielectric layer 130 on the gate electrode 122, i.e. the gate dielectric layer, the channel layer 142, the source ohmic contact layer 152, the drain ohmic contact layer 154, the source electrode 172, and the drain electrode 174 constitute a thin-film transistor. On the other hand, the bottom electrode 124, a portion of the dielectric layer 130 on the bottom electrode 124, i.e. the capacitor dielectric layer, and the top electrode 176 constitute a storage capacitor. It should be understood that although the source electrode 172 and the drain electrode 174 disclosed in this embodiment are disposed above the channel layer 142, the person having ordinary skill in the art may modify the detail structure of the thin-film transistor if necessary. For example, in some embodiments of the present invention, the channel layer may be disposed on or above the source electrode and the drain electrode to constitute the thin-film transistor.

Reference is made to FIG. 7. The manufacturer may form a passivation layer 180 to cover the source electrode 172, the channel layer 142, the drain electrode 174, the dielectric layer 130, and the top electrode 176. In this embodiment, the material of the passivation layer 180 may include silicon nitride ($SiN_x$), silicon oxide ($SiO_2$), silicon oxynitride ($SiO_xN_y$), or any combination thereof.

Reference is made to FIG. 8. The manufacturer may form a transistor contact hole 182, a capacitor contact hole 184, and a bonding pad contact hole 186 in the passivation layer 180 to respectively expose the drain electrode 174, the top electrode 176, and the bottom bonding pad 126. At the same time, the manufacturer may remove a part of the passivation layer 180 above the transparent region 113 to expose the portion of the dielectric layer 130 on the transparent region 113. In this embodiment, the transistor contact hole 182, the capacitor contact hole 184, and the bonding pad contact hole 186 are formed by photolithography and etching processes, and the part of the passivation layer 180 above the transparent region 113 may be removed by the photolithography and etching processes as well.

Reference is made to FIG. 9. The manufacturer may form a pixel electrode 192 on the portion of the dielectric layer 130 on the transparent region 113. The pixel electrode 192 may electrically connect the drain electrode 174 and the top electrode 176 through the transistor contact hole 182 and the capacitor contact hole 184. At the same time, the manufacturer may form a top bonding pad 194 on the bottom bonding pad 126. More specifically, the manufacturer may form a transparent conductive layer above the flexible substrate 110. The transparent conductive layer may cover all the structures on the flexible substrate 110. Then, the manufacturer may pattern the transparent conductive layer to form the pixel electrode 192 and the top bonding pad 194. In the present embodiment, the material of the transparent conductive layer, i.e. the pixel electrode 192 and the top bonding pad 194, may include indium tin oxide, indium zinc oxide, aluminum zinc oxide, or any combination thereof. The bottom bonding pad 126 and the top bonding pad 194 may constitute a bonding pad after the step shown in FIG. 9. The bonding pad is disposed on the bonding pad region 116 of the flexible substrate 110 to allow external circuits to be connected thereto.

In the first embodiment, the effect caused by the stress of the dielectric layer 130 created during the thermal processes is reduced since the second thickness T2 of the portion of the dielectric layer 130 on the transparent region 113 is thinner. Therefore, the deformations of the flexible substrate 110 and the glass substrate where the flexible substrate 110 is disposed are reduced. Moreover, sufficient protection can still be provided for the active device array substrate in this embodiment since the dielectric layer 130 is still on the transparent region 113. This can prevent the flexible substrate 110 from being damaged by the following semiconductor manufacturing processes and thus improves the surface roughness problem which may reduce the display quality. In addition, since the half-tone mask process is used in this embodiment to reduce the number of masks, the manufacturer may reduce the effect caused by the stress of the dielectric layer 130 without significantly increasing the manufacturing cost.

The Second Embodiment

FIG. 10 to FIG. 20 are cross-sectional views of a method for manufacturing an active device array substrate according to the second embodiment of the present invention. FIG. 46 is a top view of the active device array substrate according to the first, the second, the third, and the fourth embodiments of the present invention. As shown in FIG. 10 to FIG. 20, the area I-I represents the cross-section taken along the line I-I of FIG. 46, the area II-II represents the cross-section taken along the line II-II of FIG. 46, and the area III-III represents the cross-section taken along the line III-III of FIG. 46. The top view design of the active device array substrate shown in FIG. 46 is illustrative only and should not limit the scope of the claimed invention. The person having ordinary skill in the art may modify the top view design of the active device array substrate according to actual requirements.

As shown in FIG. 10, a manufacturer may provide a flexible substrate 110 first. The flexible substrate 110 may be flexible, such that the display panel manufactured by the following processes is also flexible. The flexible substrate 110 has a transistor region 112, a transparent region 113, a capacitor region 114, and a bonding pad region 116 adjacent to each other. In one or more embodiments of the present invention, the manufacturer may dispose the flexible substrate 110 on a glass substrate to proceed the following processes for convenience. The flexible substrate 110 may be stripped from the glass substrate after the method for manufacturing the active device array substrate is finished. In the present embodiment, the material of the flexible substrate 110 may include plastic, such as polyimide (PI), polyethylene terephthalate (PET), polyethylene naphthalate (PEN), other copolymers, or any combination thereof. It should be understood that the material of the flexible substrate 110 is illustrative only and should not limit the scope of the claimed invention. The person having ordinary skill in the art may select a proper material for the flexible substrate 110 according to actual requirements.

Then, the manufacturer may form a patterned first conductive layer on the flexible substrate 110. For example, the manufacturer may form a first conductive layer first and then pattern the first conductive layer by photolithography and etching processes to form the patterned first conductive layer on the flexible substrate 110. The patterned first conductive layer includes at least a gate electrode 122 on the transistor region 112 of the flexible substrate 110. The patterned first conductive layer further includes gate lines connected to the gate electrode 122, a bottom electrode 124 formed on the capacitor region 114 of the flexible substrate 110, and a bottom bonding pad 126 formed on the bonding pad region 116 of the flexible substrate 110. In the present embodiment, the material of the first conductive layer, i.e. the gate electrode 122, the bottom electrode 124, and the bottom bonding pad 126, may includes titanium, molybdenum, chromium, iridium, aluminum, copper, silver, gold or any combination or alloy thereof. The first conductive layer may be formed by a physical vapor deposition process, such as a sputtering deposition process, or a chemical vapor deposition process. The first conductive layer may be patterned by the photolithography and etching processes.

Reference is made to FIG. 11. The manufacturer may sequentially form a dielectric layer 130, a semiconductor layer 140, and an ohmic contact layer 150. The dielectric layer 130, the semiconductor layer 140, and the ohmic contact layer 150 cover the gate electrode 122, the bottom electrode 124, the bottom bonding pad 126, and the flexible substrate 110. The material of the dielectric layer 130 may include silicon nitride ($SiN_x$), silicon oxide ($SiO_2$), silicon oxynitride ($SiO_xN_y$), or any combination thereof. The material of the semiconductor layer 140 may include amorphous silicon, poly-silicon, oxide semiconductor, or any combination thereof. The material of the ohmic contact layer 150 may include n-doped amorphous silicon, p-doped amorphous silicon and/or so on.

Reference is made to FIG. 12. The manufacturer may pattern the semiconductor layer 140 and the ohmic contact layer 150 to remove parts of the semiconductor layer 140 and parts of the ohmic contact layer 150 above the transparent region 113, the capacitor region 114, and the bonding pad region 116 and remain a part of the semiconductor layer 140 and a part of the ohmic contact layer 150 above the transistor region 112, wherein the part of the semiconductor layer 140 above the transistor region 112 can be considered as a channel layer 142. In the present embodiment, the semiconductor layer 140 and the ohmic contact layer 150 may be patterned by photolithography and etching processes.

Figure 13:
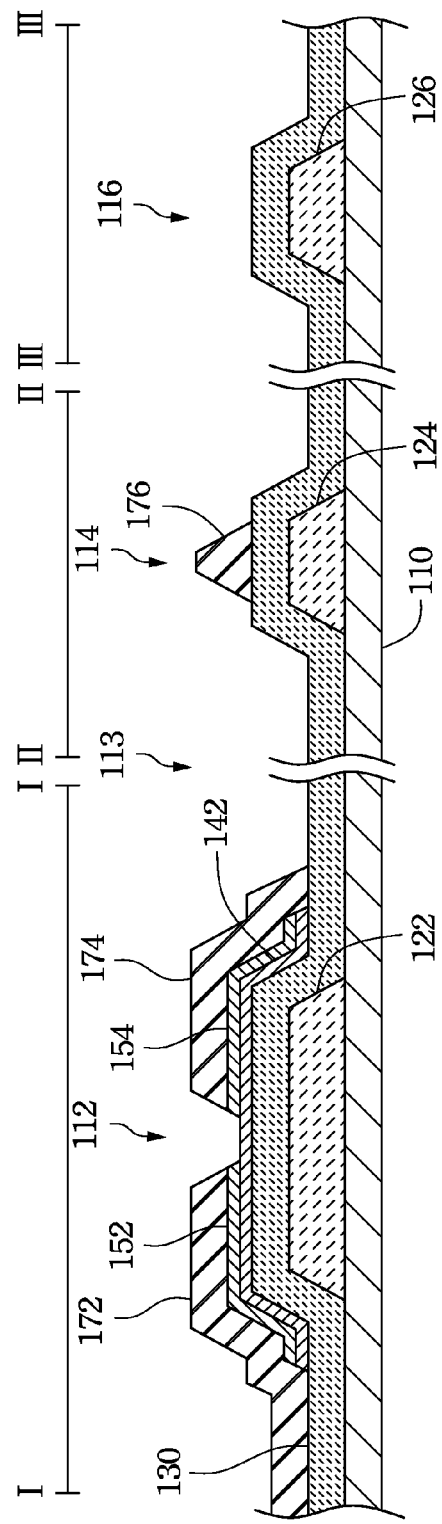

Reference is made to FIG. 13. The manufacturer may form a source electrode 172 and a drain electrode 174 above opposite sides of the channel layer 142 and form a top electrode 176 on the dielectric layer 130. The top electrode 176 is disposed above the bottom electrode 124. The source electrode 172 and the drain electrode 174 are electrically connected to the channel layer 142. More specifically, the manufacturer may form a second conductive layer above the flexible substrate 110, and the second conductive layer covers all the structures on the flexible substrate 110. Then, the manufacturer may pattern the second conductive layer to form the source electrode 172 and the drain electrode 174 above the opposite sides of the channel layer 142 and form data lines connected to the source electrode 172 on the dielectric layer 130 and the top electrode 176 on the dielectric layer 130 and above the bottom electrode 124. The manufacturer may etch a part of the ohmic contact layer 150 between the source electrode 172 and the drain electrode 174 when patterning the second conductive layer, such that the ohmic contact layer 150 is divided to a source ohmic contact layer 152 and a drain ohmic contact layer 154. The foregoing embodiment is illustrated in the case that portions of the channel layer 142 are covered by the source electrode 172 and the drain electrode 174. However, in one or more embodiments, the channel layer 142 may cover portions of the source electrode 172 and the drain electrode 174 by modifying the sequences of the manufacturing steps and defining the patterns by two masks respectively. Since this is well known in the art, the details are not illustrated hereinafter.

In the present embodiment, the material of the second conductive layer, i.e. the source electrode 172, the drain electrode 174, and the upper electrode 176, may includes titanium, molybdenum, chromium, iridium, aluminum, copper, silver, gold or any combination or alloy thereof. The second conductive layer may be formed by a physical vapor deposition process, such as a sputtering deposition process, or a chemical vapor deposition process. The second conductive layer may be patterned by photolithography and etching processes.

After the step shown in FIG. 13, the gate electrode 122, a portion of the dielectric layer 130 on the gate electrode 122, i.e. the gate dielectric layer, the channel layer 142, the source ohmic contact layer 152, the drain ohmic contact layer 154, the source electrode 172, and the drain electrode 174 constitute a thin-film transistor since the channel layer 142, the source electrode 172, and the drain electrode 174 are formed on and/or above the dielectric layer 130. On the other hand, the bottom electrode 124, a portion of the dielectric layer 130 on the bottom electrode 124, i.e. the capacitor dielectric layer, and the top electrode 176 constitute a storage capacitor. It should be understood that although the source electrode 172 and the drain electrode 174 disclosed in this embodiment are disposed on the channel layer 142, the person having ordinary skill in the art may modify the detail structure of the thin-film transistor if necessary. For example, in some embodiments of the present invention, the channel layer may be disposed on or above the source electrode and the drain electrode to constitute the thin-film transistor.

Figure 14:
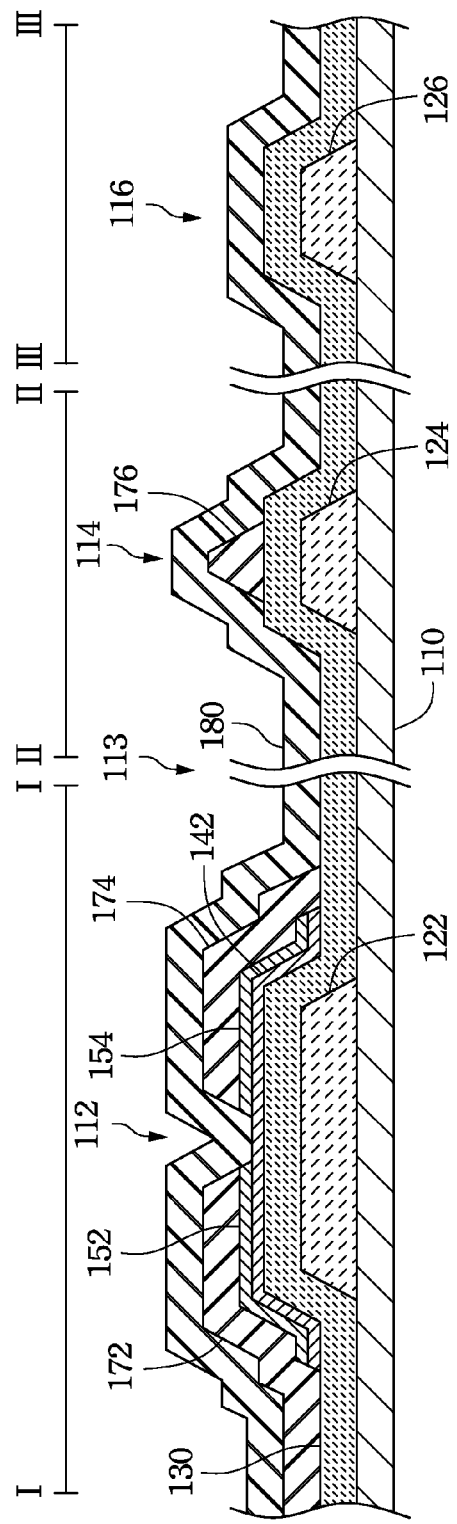

Reference is made to FIG. 14. The manufacturer may form a passivation layer 180 to cover the source electrode 172, the channel layer 142, the drain electrode 174, the dielectric layer 130, and the top electrode 176. In this embodiment, the material of the passivation layer 180 may include silicon nitride ($SiN_x$), silicon oxide ($SiO_2$), silicon oxynitride ($SiO_xN_y$), or any combination thereof.

Figure 15:
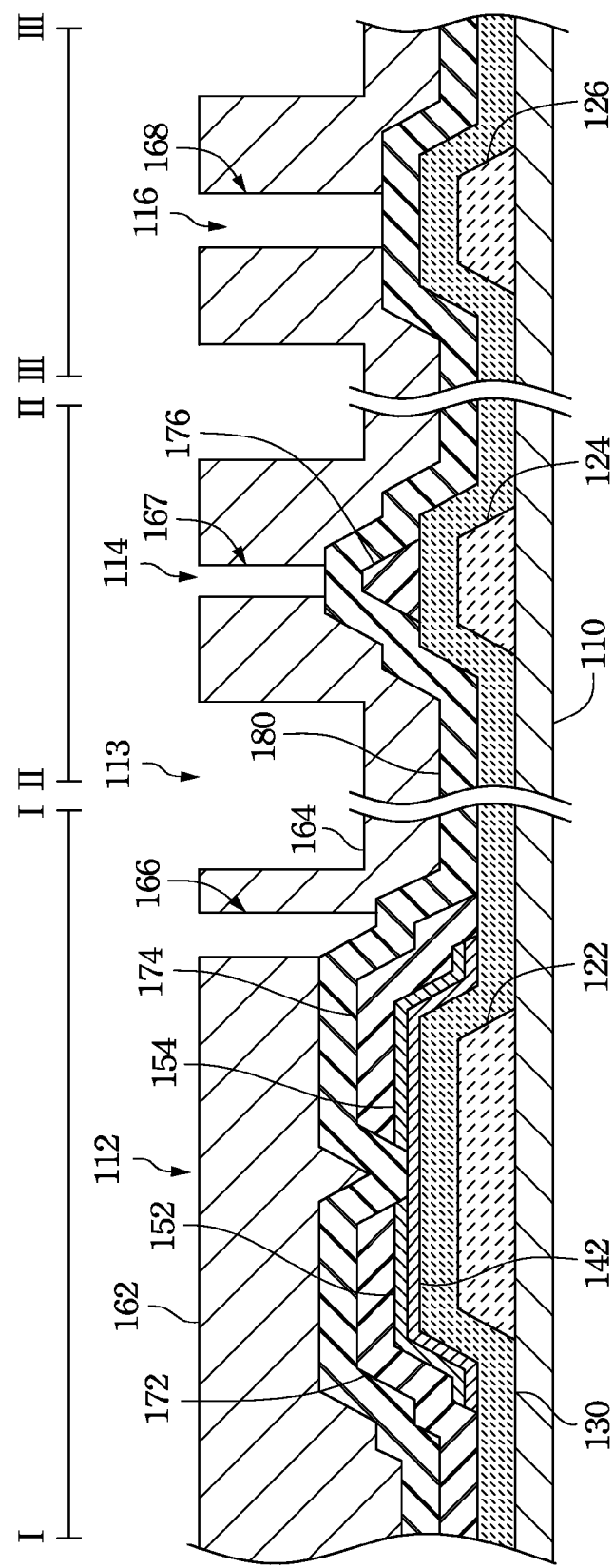

Reference is made to FIG. 15. The manufacturer may form a mask layer on the passivation layer 180. The mask layer covers the passivation layer 180. Then, the manufacturer may pattern the mask layer to form a patterned mask layer by a half-tone mask process. The patterned mask layer may include a plurality of thick mask layers 162 and a plurality of thin mask layers 164. The thick mask layers 162 are respectively disposed above the transistor region 112, the capacitor region 114, and the bonding pad region 116 of the flexible substrate 110, and the thin mask layers 164 are disposed above the transparent region 113 of the flexible substrate 110. Furthermore, the manufacturer may form a transistor etching hole 166, a capacitor etching hole 167, and a bonding pad etching hole 168 in the thick mask layers 162 to respectively expose the passivation layer 180 on the drain electrode 174, the passivation layer 180 on the top electrode 176, and the passivation layer 180 above the bottom bonding pad 126.

Figure 16:
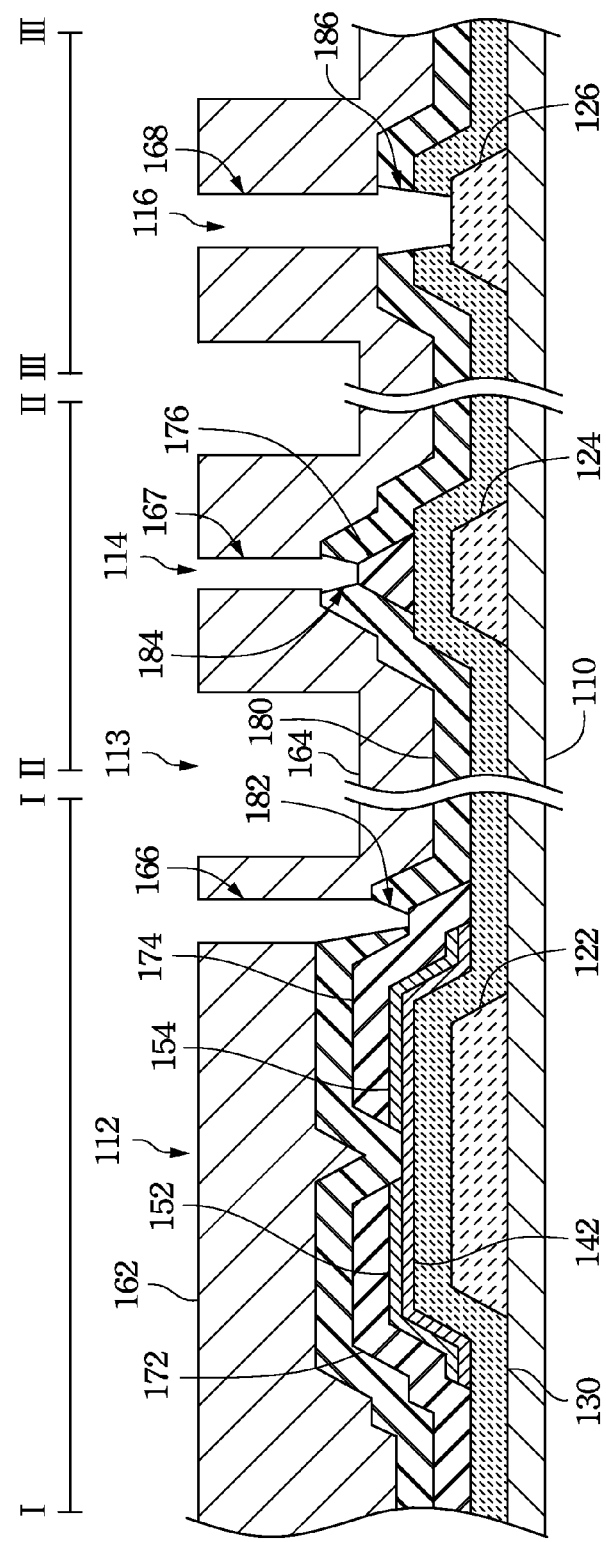

Reference is made to FIG. 16. The manufacturer may form a transistor contact hole 182, a capacitor contact hole 184, and a bonding pad contact hole 186 in the passivation layer 180 to respectively expose the drain electrode 174, the top electrode 176, and the bottom bonding pad 126 by the patterned mask layer which includes the thick mask layers 162 and the thin mask layers 164. In this embodiment, the transistor contact hole 182, the capacitor contact hole 184, and the bonding pad contact hole 186 are formed by dry etching or wet etching.

Reference is made to FIG. 17. The manufacturer may remove the thin mask layers 164 and simultaneously remove a thickness of the thick mask layers 162 to expose the passivation layer 180 above the transparent region 113. In the present embodiment, the thin mask layers 164 and the thickness of the thick mask layers 162 may be removed by an ashing process.

Reference is made to FIG. 18. The manufacturer may remove a part of the passivation layer 180 above the transparent region 113 and the dielectric layer 130 above the transparent layer 113 by the remaining patterned mask layer, i.e. the thick mask layers 162 after the thickness reduction, such that the portion of the dielectric layer 130 on the gate electrode 122 has a first thickness T1, and another portion of the dielectric layer 130 on the transparent region 113 of the flexible substrate 110 has a second thickness T2. The second thickness T2 is less than the first thickness T1. The ratio of the second thickness T2 to the first thickness T1 is 0.05-0.95, preferably 0.1-0.8, more preferably 0.3-0.6. In the present embodiment, the passivation layer 180 and the dielectric layer 130 may be removed by, for example, dry etching or wet etching.

It should be understood that although the half-tone mask process is used in the steps shown in FIG. 15 to FIG. 18 in the present embodiment for reducing the number of masks, this should not limit the scope of the claimed invention. The person having ordinary skill in the art may form the transistor contact hole 182, the capacitor contact hole 184, and the bonding pad contact hole 186 by a mask process and remove the part of the passivation layer 180 above the transparent region 113 and reduce the thickness of the portion of the dielectric layer 130 on the transparent layer 113 by another mask process if necessary.

Furthermore, a part of the passivation layer 180 above the edge of the transistor region 112 of the flexible substrate 110 may be hurt in the etching process since it is unavoidable that ashing the thick mask layers 162 and the thin mask layers 164 may cause the thick mask layers 162 shrink as indicated by the arrow S of FIG. 17. Therefore, the part of the passivation layer 180 above the edge of the transistor region 112 of the flexible substrate 110 has a fourth thickness T4, and the fourth thickness T4 is less than a thickness of a part of the passivation layer 180 above the center of the transistor region 112 of the flexible substrate 110, e.g. the fifth thickness T5. Moreover, a metal oxide dielectric layer may be hurt in the etching process if the metal oxide dielectric layer is disposed on or above the flexible substrate 110. Therefore, the thickness of the metal oxide dielectric layer may vary.

Reference is made to FIG. 19. The manufacturer may remove the remaining patterned mask layer, i.e. the thick mask layers 162 after the thickness reduction, by a stripper after the foregoing steps.

Reference is made to FIG. 20. The manufacturer may form a pixel electrode 192 on the portion of the dielectric layer 130 on the transparent region 113. The pixel electrode 192 may electrically connect the drain electrode 174 and the top electrode 176 through the transistor contact hole 182 and the capacitor contact hole 184. At the same time, the manufacturer may form a top bonding pad 194 on the bottom bonding pad 126. More specifically, the manufacturer may form a transparent conductive layer above the flexible substrate 110. The transparent conductive layer may cover all the structures on the flexible substrate 110. Then, the manufacturer may pattern the transparent conductive layer to form the pixel electrode 192 and the top bonding pad 194. In the present embodiment, the material of the transparent conductive layer, i.e. the pixel electrode 192 and the top bonding pad 194, may include indium tin oxide, indium zinc oxide, aluminum zinc oxide, or any combination thereof. The bottom bonding pad 126 and the top bonding pad 194 may constitute a bonding pad after the step shown in FIG. 20. The bonding pad is disposed on the bonding pad region 116 of the flexible substrate 110 to allow external circuits to be connected thereto.

In the second embodiment, the effect caused by the stress of the dielectric layer 130 created during the thermal processes is reduced since the second thickness T2 of the portion of the dielectric layer 130 on the transparent region 113 is thinner. Therefore, the deformations of the flexible substrate 110 and the glass substrate where the flexible substrate 110 is disposed are reduced. Moreover, sufficient protection can still be provided for the active device array substrate in this embodiment since the dielectric layer 130 is still on the transparent region 113. This can prevent the flexible substrate 110 from being damaged by the following semiconductor manufacturing processes and thus improves the surface roughness problem which may reduce the display quality. In addition, since the half-tone mask process is used in this embodiment to reduce the number of masks, the manufacturer may reduce the effect caused by the stress of the dielectric layer 130 without significantly increasing the manufacturing cost.

The Third Embodiment

FIG. 21 to FIG. 31 are cross-sectional views of a method for manufacturing an active device array substrate according to the third embodiment of the present invention. FIG. 46 is a top view of the active device array substrate according to the first, the second, the third, and the fourth embodiments of the present invention. As shown in FIG. 21 to FIG. 31, the area I-I represents the cross-section taken along the line I-I of FIG. 46, the area II-II represents the cross-section taken along the line II-II of FIG. 46, and the area III-III represents the cross-section taken along the line III-III of FIG. 46. The top view design of the active device array substrate shown in FIG. 46 is illustrative only and should not limit the scope of the claimed invention. The person having ordinary skill in the art may modify the top view design of the active device array substrate according to actual requirements.

Figure 21:
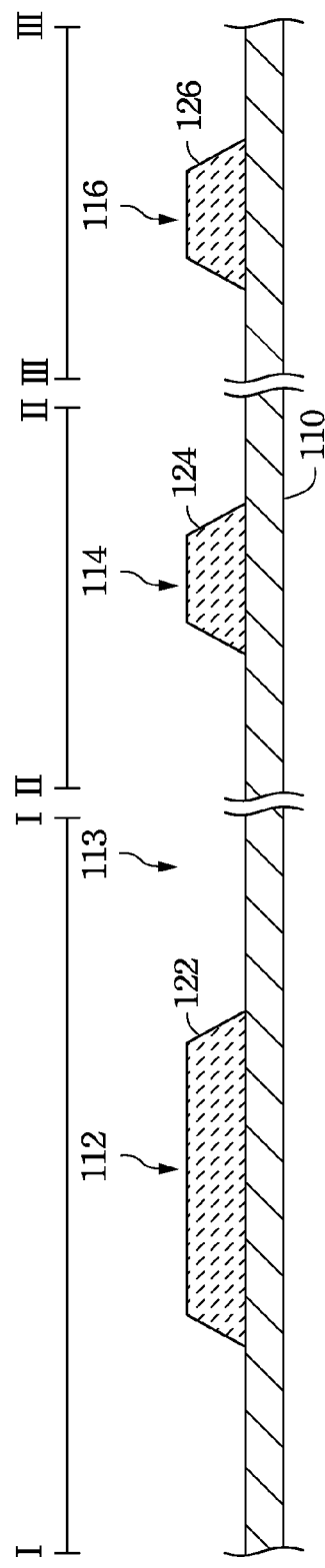

As shown in FIG. 21, a manufacturer may provide a flexible substrate 110 first. The flexible substrate 110 may be flexible, such that the display panel manufactured by the following processes is also flexible. The flexible substrate 110 has a transistor region 112, a transparent region 113, a capacitor region 114, and a bonding pad region 116 adjacent to each other. In one or more embodiments of the present invention, the manufacturer may dispose the flexible substrate 110 on a glass substrate to proceed the following processes for convenience. The flexible substrate 110 may be stripped from the glass substrate after the method for manufacturing the active device array substrate is finished. In the present embodiment, the material of the flexible substrate 110 may include plastic, such as polyimide (PI), polyethylene terephthalate (PET), polyethylene naphthalate (PEN), other copolymers, or any combination thereof. It should be understood that the material of the flexible substrate 110 is illustrative only and should not limit the scope of the claimed invention. The person having ordinary skill in the art may select a proper material for the flexible substrate 110 according to actual requirements.

Then, the manufacturer may form a patterned first conductive layer on the flexible substrate 110. For example, the manufacturer may form a first conductive layer first and then pattern the first conductive layer by photolithography and etching processes to form the patterned first conductive layer on the flexible substrate 110. The patterned first conductive layer includes at least a gate electrode 122 on the transistor region 112 of the flexible substrate 110. The patterned first conductive layer further includes gate lines connected to the gate electrode 122, a bottom electrode 124 formed on the capacitor region 114 of the flexible substrate 110, and a bottom bonding pad 126 formed on the bonding pad region 116 of the flexible substrate 110. In the present embodiment, the material of the first conductive layer, i.e. the gate electrode 122, the bottom electrode 124, and the bottom bonding pad 126, may includes titanium, molybdenum, chromium, iridium, aluminum, copper, silver, gold or any combination or alloy thereof. The first conductive layer may be formed by a physical vapor deposition process, such as a sputtering deposition process, or a chemical vapor deposition process. The first conductive layer may be patterned by the photolithography and etching processes.

Figure 22:
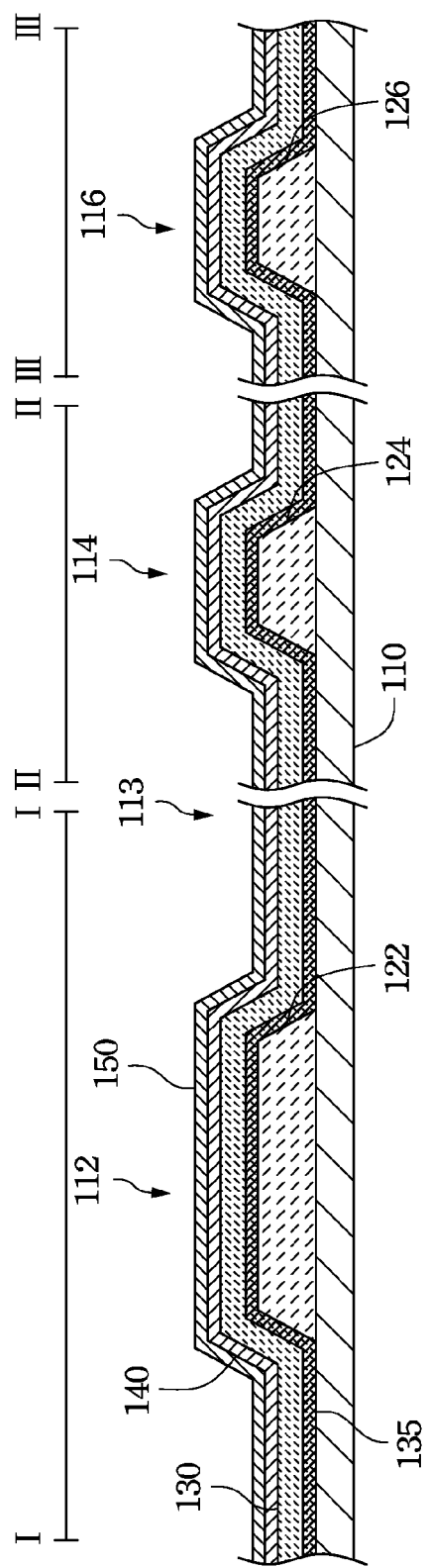

Reference is made to FIG. 22. The manufacturer may sequentially form a metal oxide dielectric layer 135, a dielectric layer 130, a semiconductor layer 140, and an ohmic contact layer 150. The metal oxide dielectric layer 135, the dielectric layer 130, the semiconductor layer 140, and the ohmic contact layer 150 cover the gate electrode 122, the bottom electrode 124, the bottom bonding pad 126, and the flexible substrate 110. The material of the metal oxide dielectric layer 135 may include indium oxide, zinc oxide, gallium oxide, or any combination thereof. The material of the dielectric layer 130 may include silicon nitride ($SiN_x$), silicon oxide ($SiO_2$), silicon oxynitride ($SiO_xN_y$), or any combination thereof. The material of the semiconductor layer 140 may include amorphous silicon, poly-silicon, oxide semiconductor, or any combination thereof. The material of the ohmic contact layer 150 may include n-doped amorphous silicon, p-doped amorphous silicon and/or so on.

Reference is made to FIG. 23. The manufacturer may pattern the semiconductor layer 140 and the ohmic contact layer 150 to remove parts of the semiconductor layer 140 and parts of the ohmic contact layer 150 above the transparent region 113, the capacitor region 114, and the bonding pad region 116 and remain a part of the semiconductor layer 140 and a part of the ohmic contact layer 150 above the transistor region 112, wherein the part of the semiconductor layer 140 above the transistor region 112 can be considered as a channel layer 142. In the present embodiment, the semiconductor layer 140 and the ohmic contact layer 150 may be patterned by photolithography and etching processes.

Reference is made to FIG. 24. The manufacturer may form a source electrode 172 and a drain electrode 174 above opposite sides of the channel layer 142 and form a top electrode 176 on the dielectric layer 130. The top electrode 176 is disposed above the bottom electrode 124. The source electrode 172 and the drain electrode 174 are electrically connected to the channel layer 142. More specifically, the manufacturer may form a second conductive layer above the flexible substrate 110, and the second conductive layer covers all the structures on the flexible substrate 110. Then, the manufacturer may pattern the second conductive layer to form the source electrode 172 and the drain electrode 174 above the opposite sides of the channel layer 142 and form data lines connected to the source electrode 172 on the dielectric layer 130 and the top electrode 176 on the dielectric layer 130 and above the bottom electrode 124. The manufacturer may etch a part of the ohmic contact layer 150 between the source electrode 172 and the drain electrode 174 when patterning the second conductive layer, such that the ohmic contact layer 150 is divided to a source ohmic contact layer 152 and a drain ohmic contact layer 154. The foregoing embodiment is illustrated in the case that portions of the channel layer 142 are covered by the source electrode 172 and the drain electrode 174. However, in one or more embodiments, the channel layer 142 may cover portions of the source electrode 172 and the drain electrode 174 by modifying the sequences of the manufacturing steps and defining the patterns by two masks respectively. Since this is well known in the art, the details are not illustrated hereinafter.

In the present embodiment, the material of the second conductive layer, i.e. the source electrode 172, the drain electrode 174, and the upper electrode 176, may includes titanium, molybdenum, chromium, iridium, aluminum, copper, silver, gold or any combination or alloy thereof. The second conductive layer may be formed by a physical vapor deposition process, such as a sputtering deposition process, or a chemical vapor deposition process. The second conductive layer may be patterned by the photolithography and etching processes.

After the step shown in FIG. 24, the gate electrode 122, a portion of the metal oxide dielectric layer 135 and a portion of the dielectric layer 130 on the gate electrode 122, i.e. the gate dielectric layer, the channel layer 142, the source ohmic contact layer 152, the drain ohmic contact layer 154, the source electrode 172, and the drain electrode 174 constitute a thin-film transistor since the channel layer 142, the source electrode 172, and the drain electrode 174 are formed on and/or above the dielectric layer 130. On the other hand, the bottom electrode 124, a portion of the metal oxide dielectric layer 135 and the dielectric layer 130 above the bottom electrode 124, i.e. the capacitor dielectric layer, and the top electrode 176 constitute a storage capacitor. It should be understood that although the source electrode 172 and the drain electrode 174 disclosed in this embodiment are disposed above the channel layer 142, the person having ordinary skill in the art may modify the detail structure of the thin-film transistor if necessary. For example, in some embodiments of the present invention, the channel layer may be disposed on or above the source electrode and the drain electrode to constitute the thin-film transistor.

Figure 25:
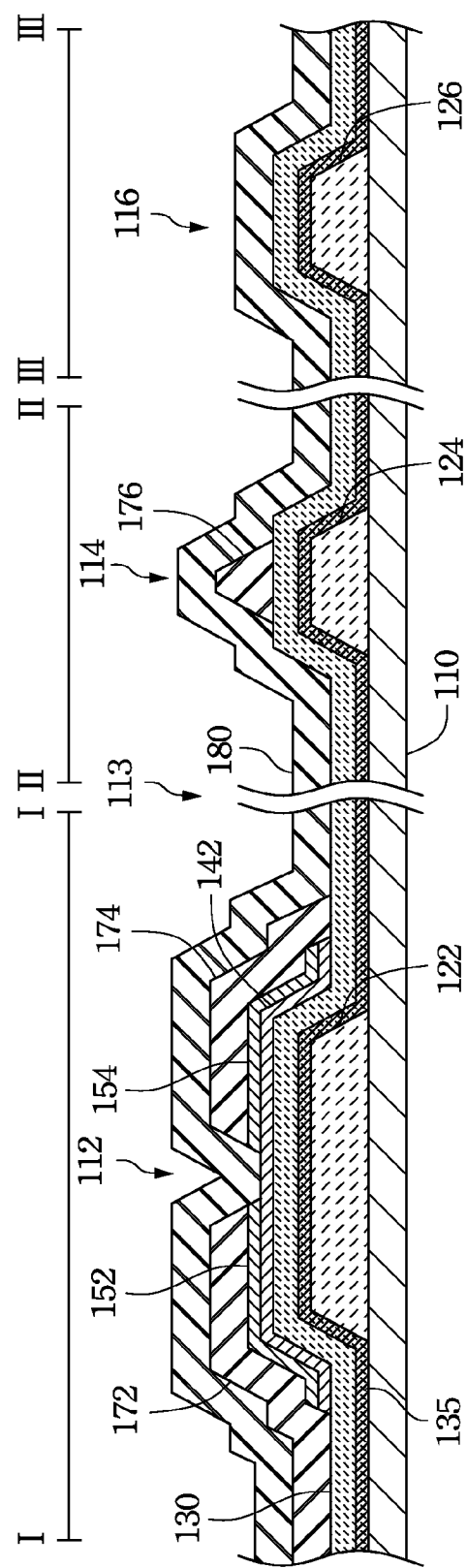

Reference is made to FIG. 25. The manufacturer may form a passivation layer 180 to cover the source electrode 172, the channel layer 142, the drain electrode 174, the dielectric layer 130, and the top electrode 176. In this embodiment, the material of the passivation layer 180 may include silicon nitride ($SiN_x$), silicon oxide ($SiO_2$), silicon oxynitride ($SiO_xN_y$), or any combination thereof.

Figure 26:
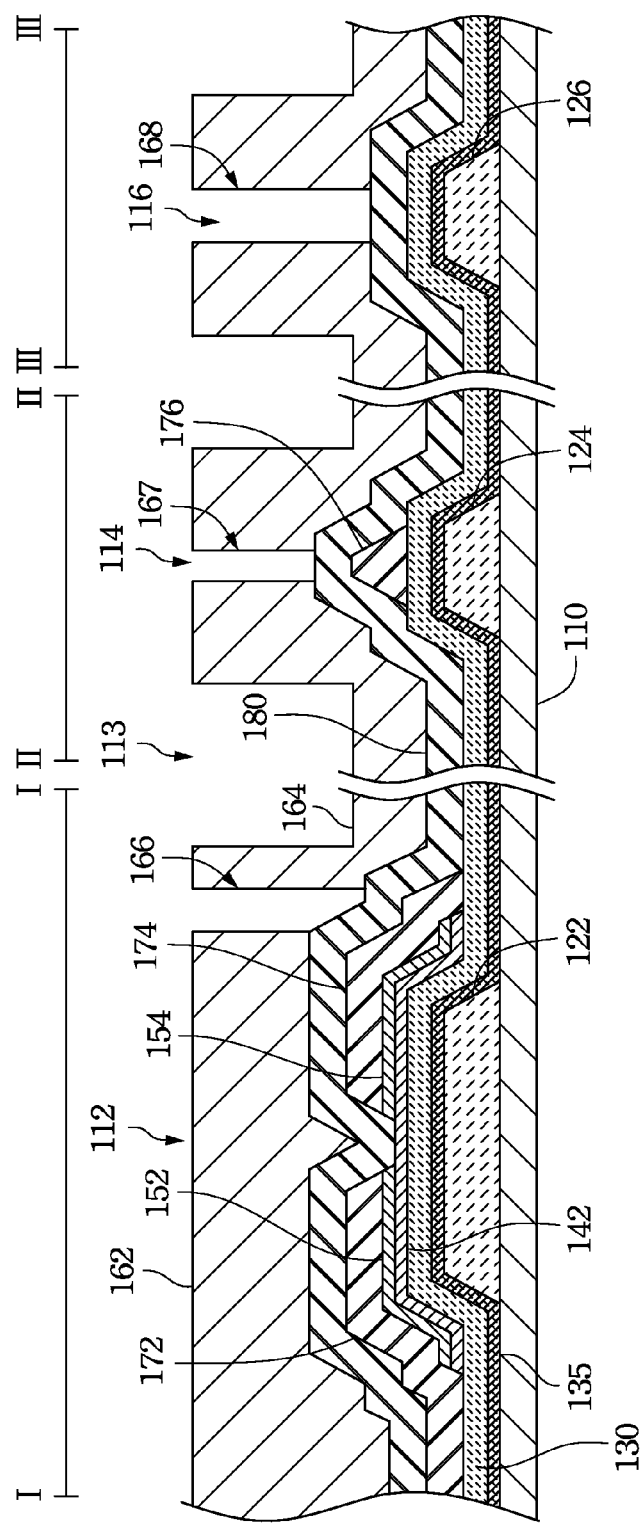

Reference is made to FIG. 26. The manufacturer may form a mask layer on the passivation layer 180. The mask layer covers the passivation layer 180. Then, the manufacturer may pattern the mask layer to form a patterned mask layer by a half-tone mask process. The patterned mask layer may include a plurality of thick mask layers 162 and a plurality of thin mask layers 164. The thick mask layers 162 are respectively disposed above the transistor region 112, the capacitor region 114, and the bonding pad region 116 of the flexible substrate 110, and the thin mask layers 164 are disposed above the transparent region 113 of the flexible substrate 110. Furthermore, the manufacturer may form a transistor etching hole 166, a capacitor etching hole 167, and a bonding pad etching hole 168 in the thick mask layers 162 to respectively expose the passivation layer 180 on the drain electrode 174, the passivation layer 180 on the top electrode 176, and the passivation layer 180 above the bottom bonding pad 126.

Figure 27:
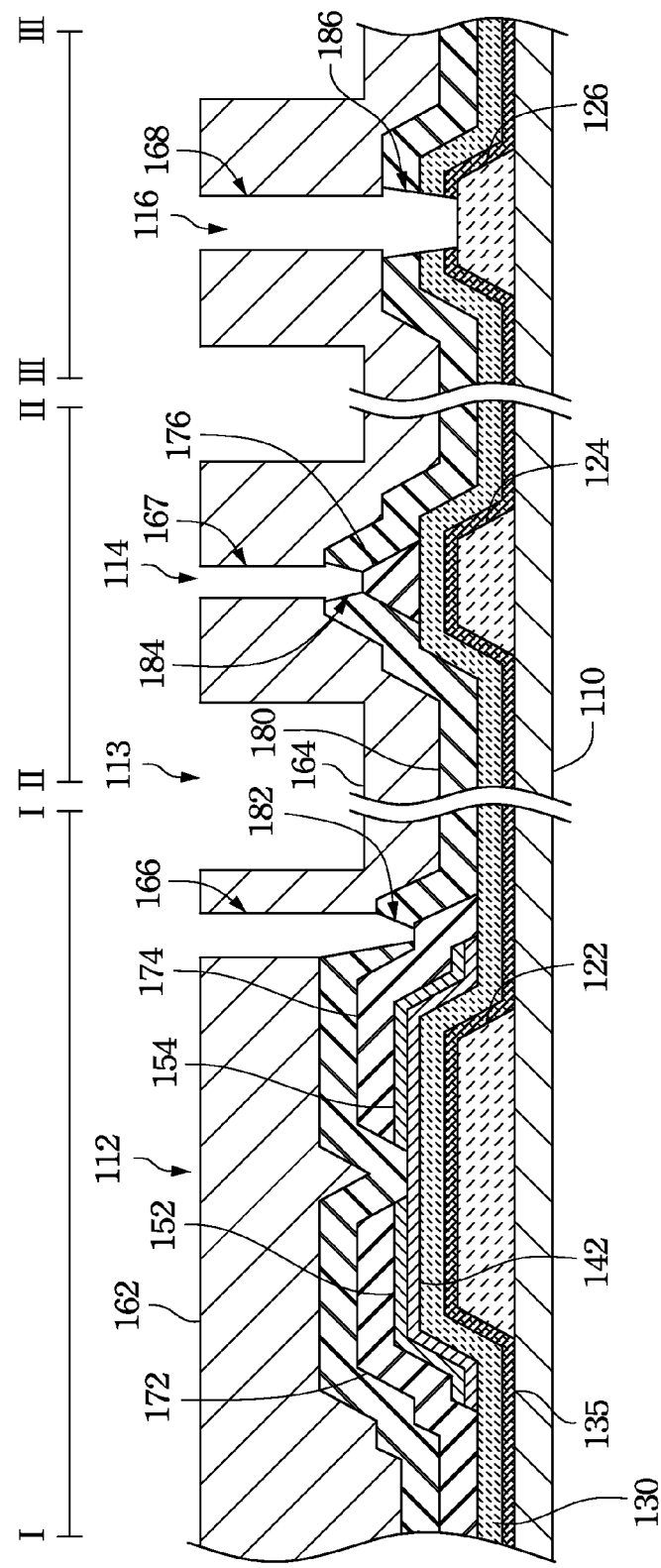

Reference is made to FIG. 27. The manufacturer may form a transistor contact hole 182, a capacitor contact hole 184, and a bonding pad contact hole 186 in the passivation layer 180 to respectively expose the drain electrode 174, the top electrode 176, and the bottom bonding pad 126 by the patterned mask layer which includes the thick mask layers 162 and the thin mask layers 164. In this embodiment, the transistor contact hole 182, the capacitor contact hole 184, and the bonding pad contact hole 186 are formed by dry etching or wet etching.

Reference is made to FIG. 28. The manufacturer may remove the thin mask layers 164 and simultaneously remove a thickness of the thick mask layers 162 to expose the passivation layer 180 above the transparent region 113. In the present embodiment, the thin mask layers 164 and the thickness of the thick mask layers 162 may be removed by an ashing process.

Reference is made to FIG. 29. The manufacturer may remove a part of the passivation layer 180 above the transparent region 113 and the dielectric layer 130 above the transparent layer 113 by the remaining patterned mask layer, i.e. the thick mask layers 162 after the thickness reduction, such that the portion of the dielectric layer 130 above the gate electrode 122 has a first thickness T1, and a portion of the dielectric layer 130 above the transparent region 113 of the flexible substrate 110 has a second thickness T2. The second thickness T2 is less than the first thickness T1. The ratio of the second thickness T2 to the first thickness T1 is 0.05-0.95, preferably 0.1-0.8, more preferably 0.3-0.6. In the present embodiment, the passivation layer 180 and the dielectric layer 130 may be removed by, for example, dry etching or wet etching.

It should be understood that although the half-tone mask process is used in the steps shown in FIG. 26 to FIG. 29 in the present embodiment for reducing the number of masks, this should not limit the scope of the claimed invention. The person having ordinary skill in the art may form the transistor contact hole 182, the capacitor contact hole 184, and the bonding pad contact hole 186 by a mask process and remove the part of the passivation layer 180 above the transparent region 113 and reduce the thickness of the portion of the dielectric layer 130 above the transparent layer 113 by another mask process if necessary.

Furthermore, a part of the passivation layer 180 above the edge of the transistor region 112 of the flexible substrate 110 may be hurt in the etching process since it is unavoidable that ashing the thick mask layers 162 and the thin mask layers 164 may cause the thick mask layers 162 shrink as indicated by the arrow S of FIG. 28. Therefore, the part of the passivation layer 180 above the edge of the transistor region 112 of the flexible substrate 110 has a fourth thickness T4, and the fourth thickness T4 is less than a thickness of a part of the passivation layer 180 above the center of the transistor region 112 of the flexible substrate 110, e.g. the fifth thickness T5.

Reference is made to FIG. 30. The manufacturer may remove the remaining patterned mask layer, i.e. the thick mask layers 162 after the thickness reduction, by a stripper after the foregoing steps.

Reference is made to FIG. 31. The manufacturer may form a pixel electrode 192 on the portion of the dielectric layer 130 above the transparent region 113. The pixel electrode 192 may electrically connect the drain electrode 174 and the top electrode 176 through the transistor contact hole 182 and the capacitor contact hole 184. At the same time, the manufacturer may form a top bonding pad 194 on the bottom bonding pad 126. More specifically, the manufacturer may form a transparent conductive layer above the flexible substrate 110. The transparent conductive layer may cover all the structures on the flexible substrate 110. Then, the manufacturer may pattern the transparent conductive layer to form the pixel electrode 192 and the top bonding pad 194. In the present embodiment, the material of the transparent conductive layer, i.e. the pixel electrode 192 and the top bonding pad 194, may include indium tin oxide, indium zinc oxide, aluminum zinc oxide, or any combination thereof. The bottom bonding pad 126 and the top bonding pad 194 may constitute a bonding pad after the step shown in FIG. 31. The bonding pad is disposed on the bonding pad region 116 of the flexible substrate 110 to allow external circuits to be connected thereto.

In the third embodiment, the effect caused by the stress of the dielectric layer 130 created during the thermal processes is reduced since the second thickness T2 of the portion of the dielectric layer 130 above the transparent region 113 is thinner. Therefore, the deformations of the flexible substrate 110 and the glass substrate where the flexible substrate 110 is disposed are reduced. On the other hand, the metal oxide dielectric layer 135 disposed between the dielectric layer 130 and the flexible substrate 110 enhances the adhesion of the structure on the flexible substrate 110 to the flexible substrate 110. Therefore, the probability of peeling the structure on the flexible substrate 110 from the flexible substrate 110 during the manufacturing processes can be reduced. Moreover, sufficient protection can still be provided for the active device array substrate in this embodiment since the dielectric layer 130 is still above the transparent region 113. This can prevent the flexible substrate 110 from being damaged by the following semiconductor manufacturing processes and thus improves the surface roughness problem which may reduce the display quality. In addition, since the half-tone mask process is used in this embodiment to reduce the number of masks, the manufacturer may reduce the effect caused by the stress of the dielectric layer 130 without significantly increasing the manufacturing cost.

The Fourth Embodiment

FIG. 32 to FIG. 45 are cross-sectional views of a method for manufacturing an active device array substrate according to the fourth embodiment of the present invention. FIG. 46 is a top view of the active device array substrate according to the first, the second, the third, and the fourth embodiments of the present invention. As shown in FIG. 32 to FIG. 45, the area I-I represents the cross-section taken along the line I-I of FIG. 46, the area II-II represents the cross-section taken along the line II-II of FIG. 46, and the area III-III represents the cross-section taken along the line III-III of FIG. 46. The top view design of the active device array substrate shown in FIG. 46 is illustrative only and should not limit the scope of the claimed invention. The person having ordinary skill in the art may modify the top view design of the active device array substrate according to actual requirements.

Figure 32:
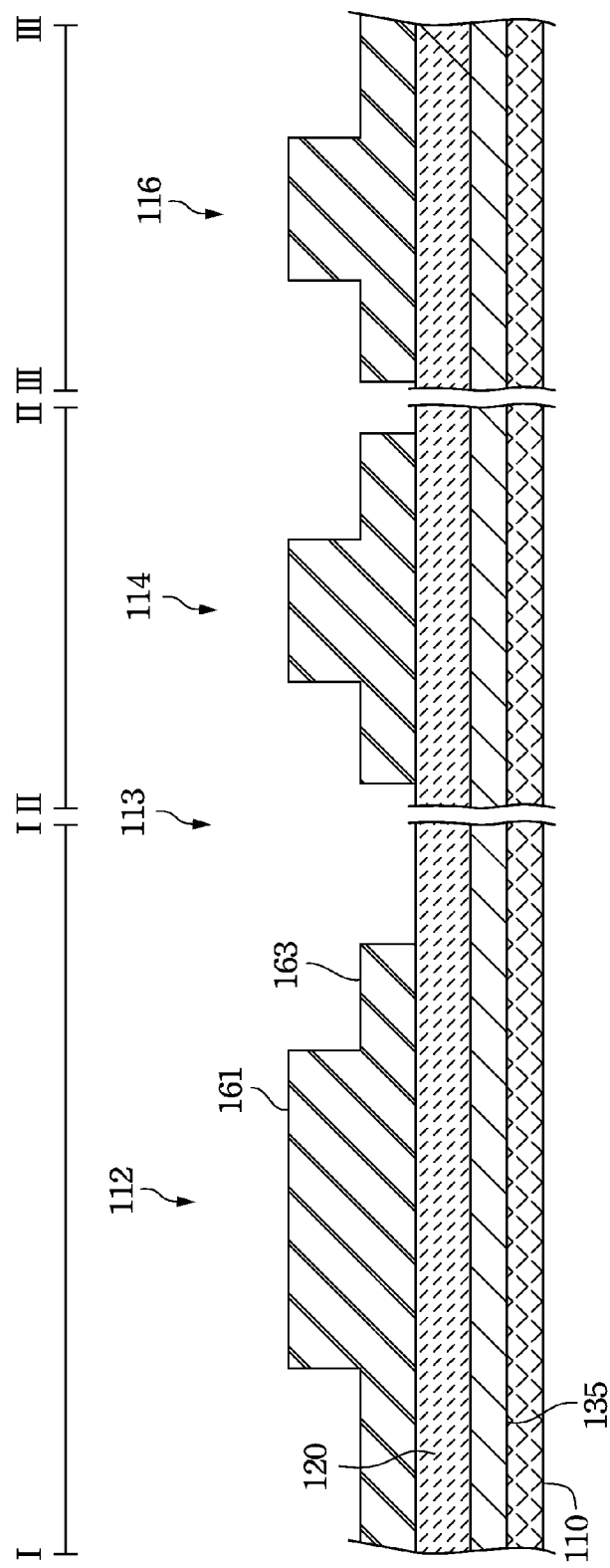

As shown in FIG. 32, a manufacturer may provide a flexible substrate 110 first. The flexible substrate 110 may be flexible, such that the display panel manufactured by the following processes is also flexible. The flexible substrate 110 has a transistor region 112, a transparent region 113, a capacitor region 114, and a bonding pad region 116 adjacent to each other. In one or more embodiments of the present invention, the manufacturer may dispose the flexible substrate 110 on a glass substrate to proceed the following processes for convenience. The flexible substrate 110 may be stripped from the glass substrate after the method for manufacturing the active device array substrate is finished. In the present embodiment, the material of the flexible substrate 110 may include plastic, such as polyimide (PI), polyethylene terephthalate (PET), polyethylene naphthalate (PEN), other copolymers, or any combination thereof. It should be understood that the material of the flexible substrate 110 is illustrative only and should not limit the scope of the claimed invention. The person having ordinary skill in the art may select a proper material for the flexible substrate 110 according to actual requirements.

Then, the manufacturer may sequentially form a metal oxide dielectric layer 135 and a first conductive layer 120. In this embodiment, the material of the metal oxide dielectric layer 135 may include indium oxide, zinc oxide, gallium oxide, or any combination thereof. The material of the first conductive layer 120 may include titanium, molybdenum, chromium, iridium, aluminum, copper, silver, gold or any combination or alloy thereof. The first conductive layer 120 may be formed by a physical vapor deposition process, such as a sputtering deposition process, or a chemical vapor deposition process.

The manufacturer may form a mask layer on the first conductive layer 120. The mask layer covers the first conductive layer 120. Then, the manufacturer may pattern the mask layer to form a patterned mask layer by a half-tone mask process. The patterned mask layer may include a plurality of thick mask layers 161 and a plurality of thin mask layers 163. The thick mask layers 161 are respectively disposed above positions where a gate electrode 122, a bottom electrode 124, and a bottom bonding pad 126 (shown in FIG. 35 to FIG. 45) are expected to be respectively formed. The thin mask layers 163 are respectively disposed adjacent to the thick mask layers 161 and expose the first conductive layer 120 above the transparent region 113.

Figure 33:
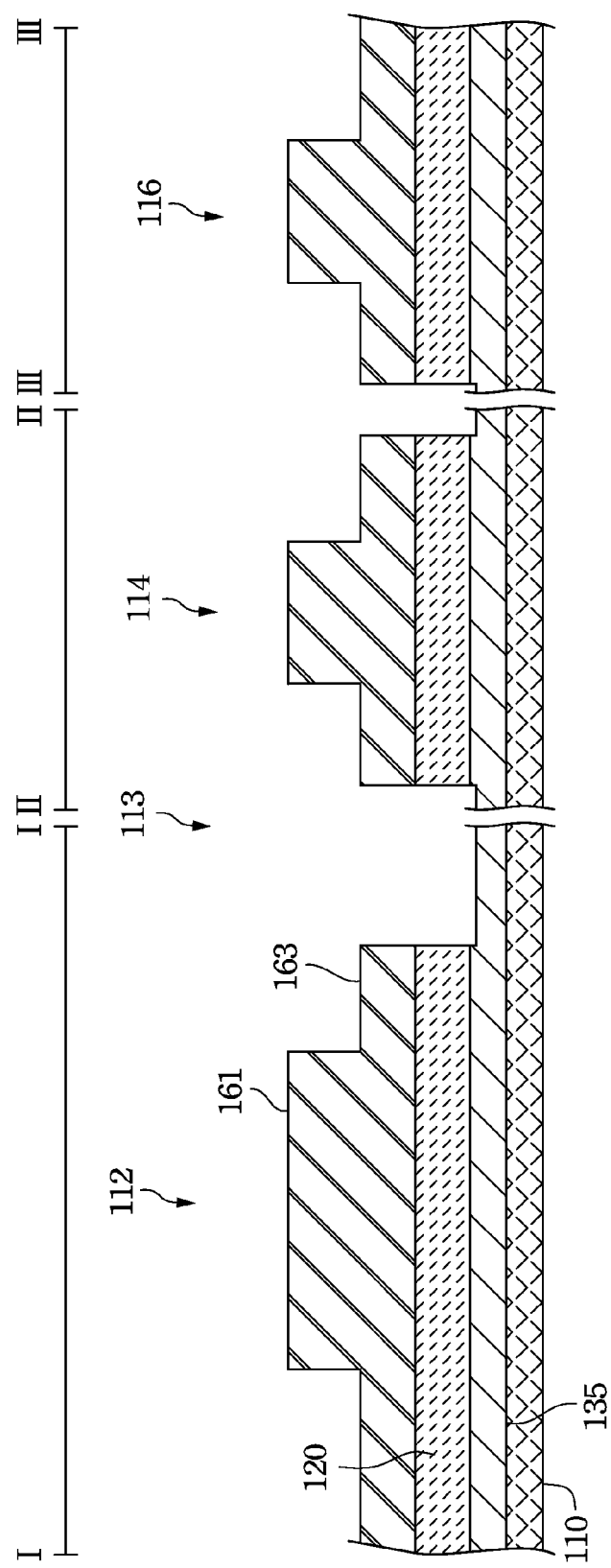

Reference is made to FIG. 33. The manufacturer may remove a part of the first conductive layer 120 above the transparent region 113 by the patterned mask layer (including the thick mask layers 161 and the thin mask layers 163) and simultaneously remove a thickness of a part of the metal oxide dielectric layer 135 on the transparent region 113. In the present embodiment, the first conductive layer 120 and the metal oxide dielectric layer 135 may be removed by, for example, dry etching or wet etching.

Figure 34:
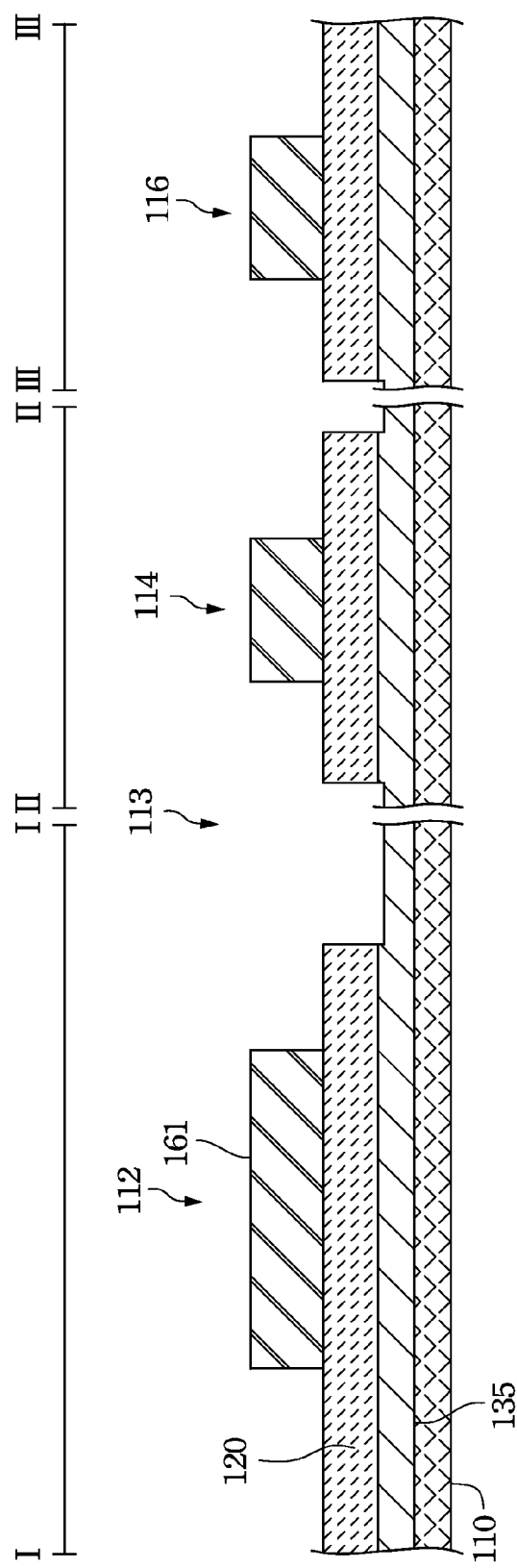

Reference is made to FIG. 34. The manufacturer may remove the thin mask layers 163 and simultaneously remove a thickness of the thick mask layers 161. In the present embodiment, the thin mask layers 163 and the thickness of the thick mask layers 161 may be removed by an ashing process.

Figure 35:
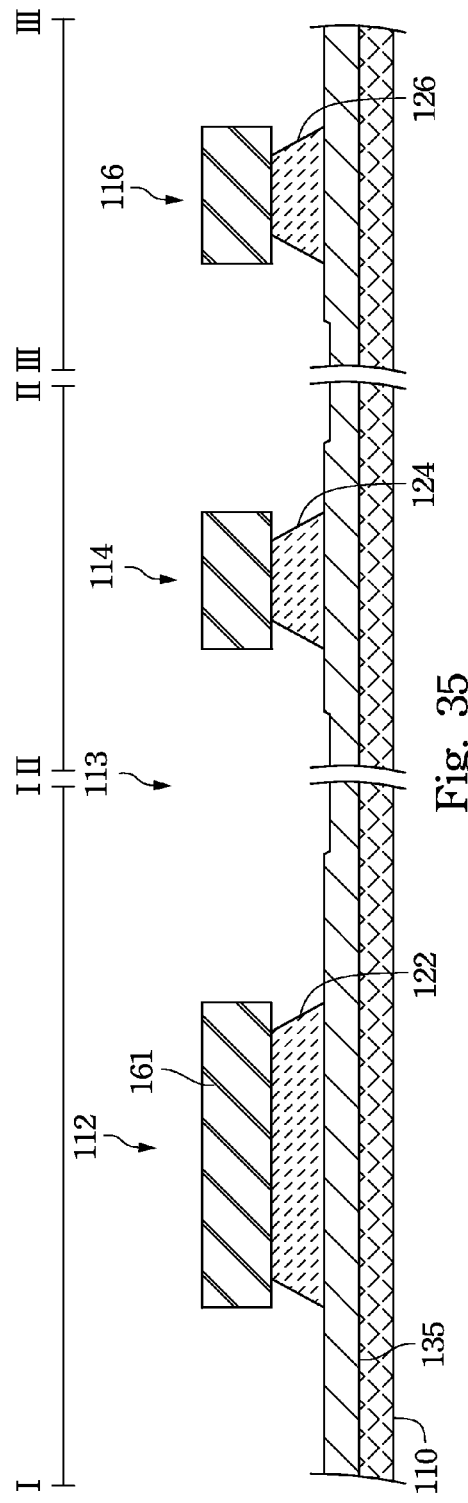

Reference is made to FIG. 35. The manufacturer may remove portions of the first conductive layer 120 above the transistor region 112, the capacitor region 114, and the bonding pad region 116 to form the gate electrode 122, gate lines connected to the gate electrode 122, the bottom electrode 124, and the bottom bonding pad 126 by the remaining patterned mask layer, i.e. the thick mask layers 161 after the thickness reduction.

It should be understood that although the half-tone mask process is used in the steps shown in FIG. 32 to FIG. 35 in the present embodiment for reducing the number of masks, this should not limit the scope of the claimed invention. The person having ordinary skill in the art may form the structure shown in FIG. 33 by a mask process and form the structure shown in FIG. 35 by another mask process if necessary.

Figure 36:
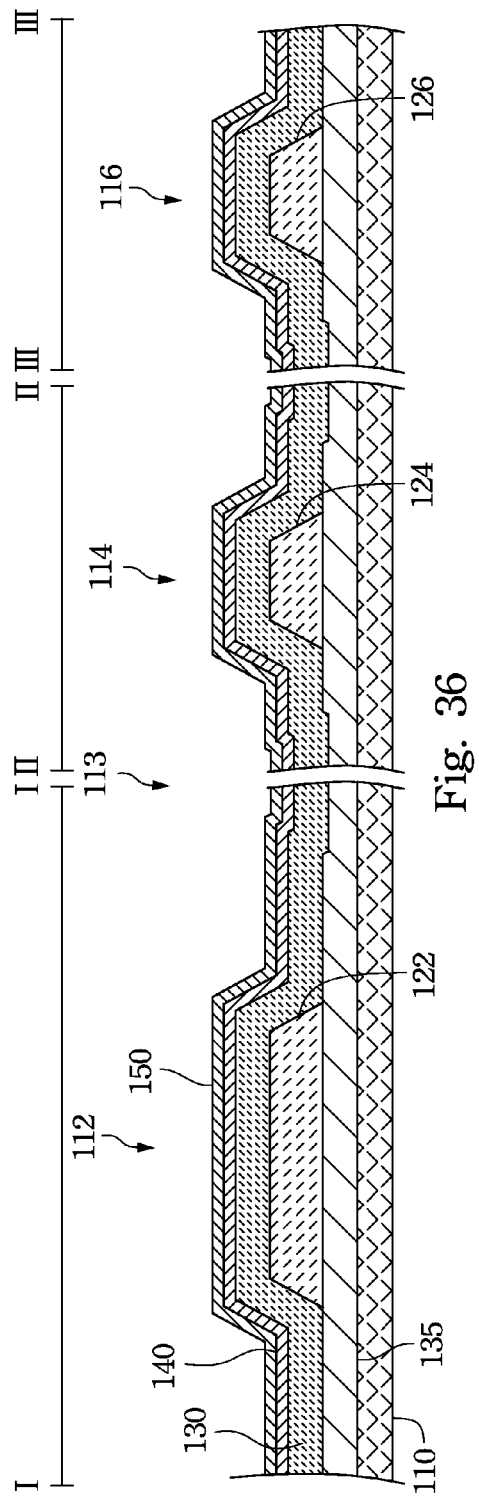

Reference is made to FIG. 36. The manufacturer may remove the remaining patterned mask layer, i.e. the thick mask layers 161 after the thickness reduction, by a stripper after the foregoing steps. Then, the manufacturer may sequentially form a dielectric layer 130, a semiconductor layer 140, and an ohmic contact layer 150. The dielectric layer 130, the semiconductor layer 140, and the ohmic contact layer 150 cover the gate electrode 122, the bottom electrode 124, the bottom bonding pad 126, the metal oxide dielectric layer 135, and the flexible substrate 110. The material of the dielectric layer 130 may include silicon nitride ($SiN_x$), silicon oxide ($SiO_2$), silicon oxynitride ($SiO_xN_y$), or any combination thereof. The material of the semiconductor layer 140 may include amorphous silicon, poly-silicon, oxide semiconductor, or any combination thereof. The material of the ohmic contact layer 150 may include n-doped amorphous silicon, p-doped amorphous silicon and/or so on.

Reference is made to FIG. 37. The manufacturer may pattern the semiconductor layer 140 and the ohmic contact layer 150 to remove parts of the semiconductor layer 140 and parts of the ohmic contact layer 150 above the transparent region 113, the capacitor region 114, and the bonding pad region 116 and remain a part of the semiconductor layer 140 and a part of the ohmic contact layer 150 above the transistor region 112, wherein the part of the semiconductor layer 140 above the transistor region 112 can be considered as a channel layer 142. In the present embodiment, the semiconductor layer 140 and the ohmic contact layer 150 may be patterned by photolithography and etching processes.

Reference is made to FIG. 38. The manufacturer may form a source electrode 172 and a drain electrode 174 above opposite sides of the channel layer 142 and form a top electrode 176 on and/or above the dielectric layer 130. The top electrode 176 is disposed above the bottom electrode 124. The source electrode 172 and the drain electrode 174 are electrically connected to the channel layer 142. More specifically, the manufacturer may form a second conductive layer above the flexible substrate 110, and the second conductive layer covers all the structures on the flexible substrate 110. Then, the manufacturer may pattern the second conductive layer to form the source electrode 172 and the drain electrode 174 above the opposite sides of the channel layer 142 and form data lines connected to the source electrode 172 above the dielectric layer 130 and the top electrode 176 on the dielectric layer 130 and above the bottom electrode 124. The manufacturer may etch a part of the ohmic contact layer 150 between the source electrode 172 and the drain electrode 174 when patterning the second conductive layer, such that the ohmic contact layer 150 is divided to a source ohmic contact layer 152 and a drain ohmic contact layer 154. The foregoing embodiment is illustrated in the case that portions of the channel layer 142 are covered by the source electrode 172 and the drain electrode 174. However, in one or more embodiments, the channel layer 142 may cover portions of the source electrode 172 and the drain electrode 174 by modifying the sequences of the manufacturing steps and defining the patterns by two masks respectively. Since this is well known in the art, the details are not illustrated hereinafter.

In the present embodiment, the material of the second conductive layer, i.e. the source electrode 172, the drain electrode 174, and the upper electrode 176, may includes titanium, molybdenum, chromium, iridium, aluminum, copper, silver, gold or any combination or alloy thereof. The second conductive layer may be formed by a physical vapor deposition process, such as a sputtering deposition process, or a chemical vapor deposition process. The second conductive layer may be patterned by the photolithography and etching processes.

After the step shown in FIG. 38, the gate electrode 122, a portion of the dielectric layer 130 on the gate electrode 122, i.e. the gate dielectric layer, the channel layer 142, the source ohmic contact layer 152, the drain ohmic contact layer 154, the source electrode 172, and the drain electrode 174 constitute a thin-film transistor since the channel layer 142, the source electrode 172, and the drain electrode 174 are formed on and/or above the dielectric layer 130. On the other hand, the bottom electrode 124, a portion of the dielectric layer 130 on the bottom electrode 124, i.e. the capacitor dielectric layer, and the top electrode 176 constitute a storage capacitor. It should be understood that although the source electrode 172 and the drain electrode 174 disclosed in this embodiment are disposed above the channel layer 142, the person having ordinary skill in the art may modify the detail structure of the thin-film transistor if necessary. For example, in some embodiments of the present invention, the channel layer may be disposed on or above the source electrode and the drain electrode to constitute the thin-film transistor.

Figure 39:
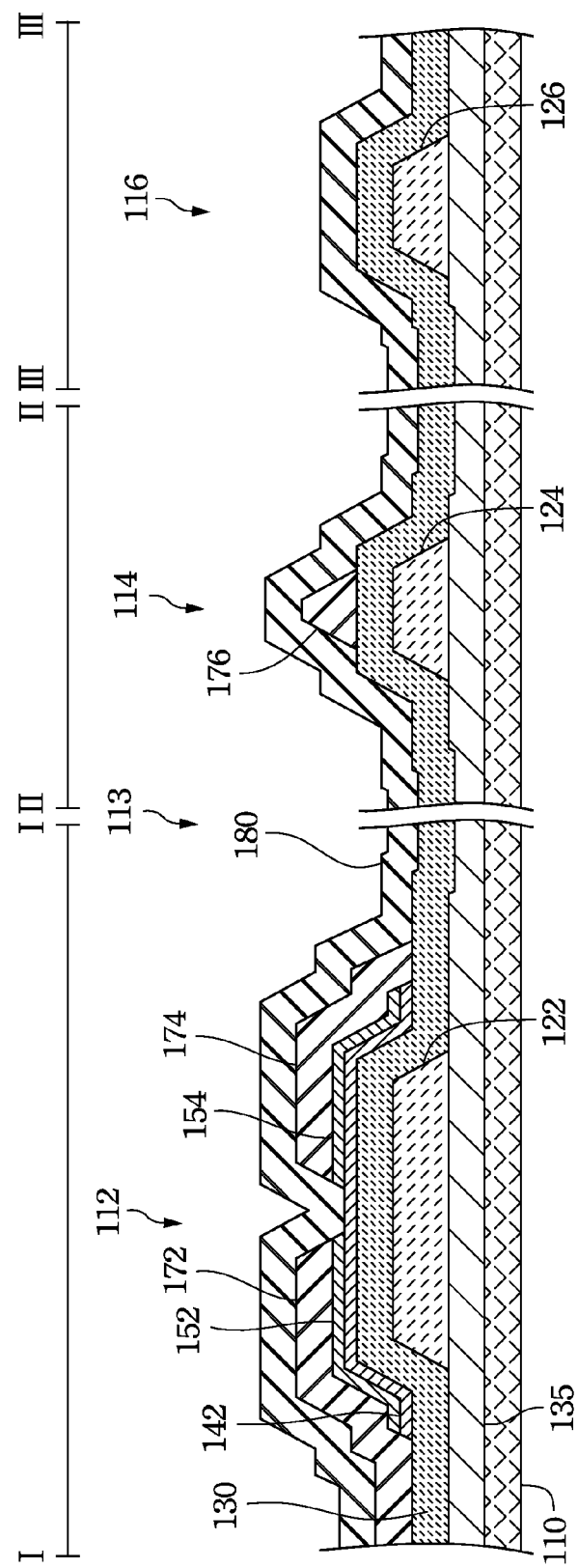

Reference is made to FIG. 39. The manufacturer may form a passivation layer 180 to cover the source electrode 172, the channel layer 142, the drain electrode 174, the dielectric layer 130, and the top electrode 176. In this embodiment, the material of the passivation layer 180 may include silicon nitride ($SiN_x$), silicon oxide ($SiO_2$), silicon oxynitride ($SiO_xN_y$), or any combination thereof.

Figure 40:
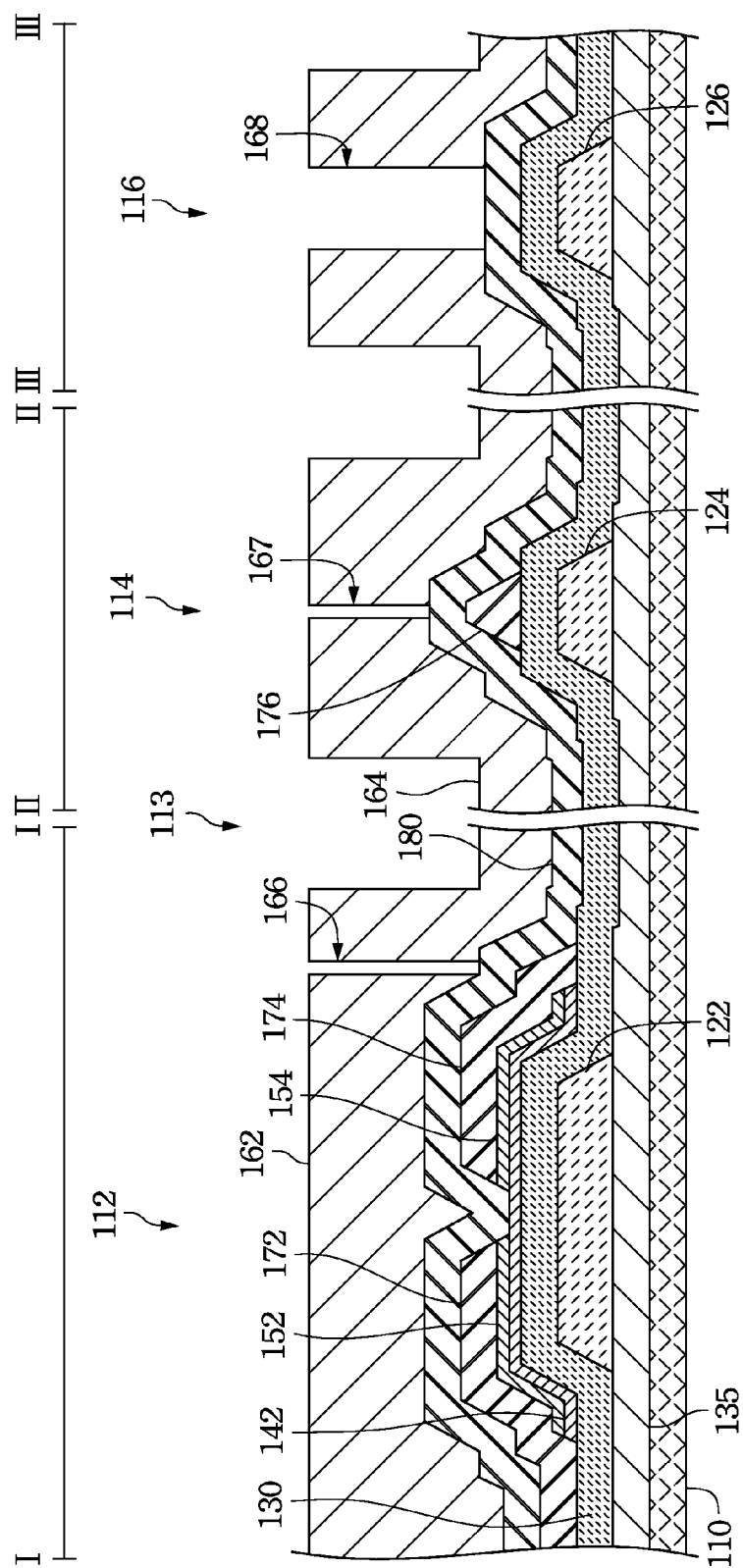

Reference is made to FIG. 40. The manufacturer may form a mask layer on the passivation layer 180. The mask layer covers the passivation layer 180. Then, the manufacturer may pattern the mask layer to form a patterned mask layer by a half-tone mask process. The patterned mask layer may include a plurality of thick mask layers 162 and a plurality of thin mask layers 164. The thick mask layers 162 are respectively disposed above the transistor region 112, capacitor region 114, and the bonding pad region 116 of the flexible substrate 110, and the thin mask layers 164 is disposed above the transparent region 113 of the flexible substrate 110. Furthermore, the manufacturer may form a transistor etching hole 166, a capacitor etching hole 167, and a bonding pad etching hole 168 in the thick mask layers 162 to respectively expose the passivation layer 180 on the drain electrode 174, the passivation layer 180 on the top electrode 176, and the passivation layer 180 above the bottom bonding pad 126.

Figure 41:
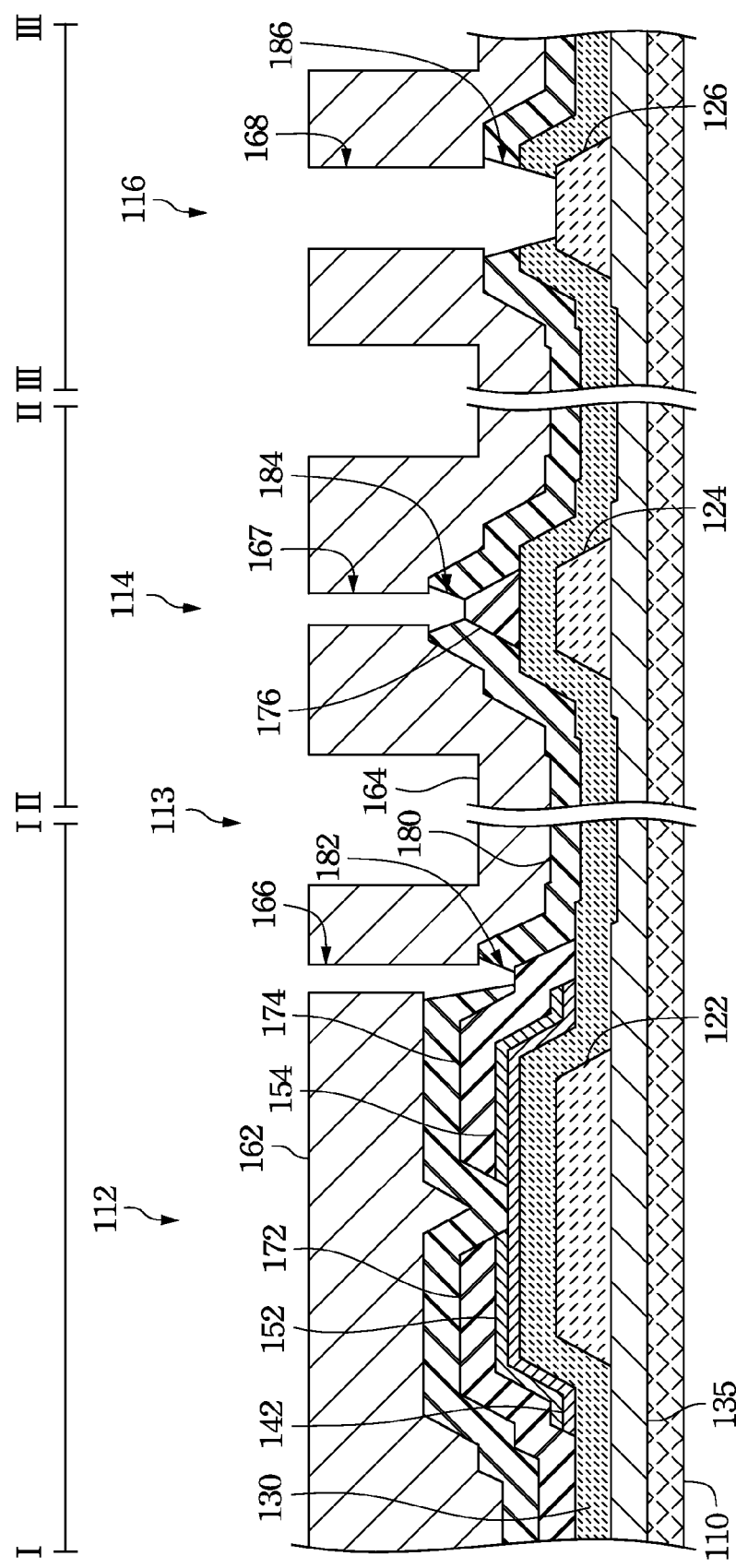

Reference is made to FIG. 41. The manufacturer may form a transistor contact hole 182, a capacitor contact hole 184, and a bonding pad contact hole 186 in the passivation layer 180 to respectively expose the drain electrode 174, the top electrode 176, and the bottom bonding pad 126 by the patterned mask layer which includes the thick mask layers 162 and the thin mask layers 164. In this embodiment, the transistor contact hole 182, the capacitor contact hole 184, and the bonding pad contact hole 186 are formed by dry etching or wet etching.

Figure 42:
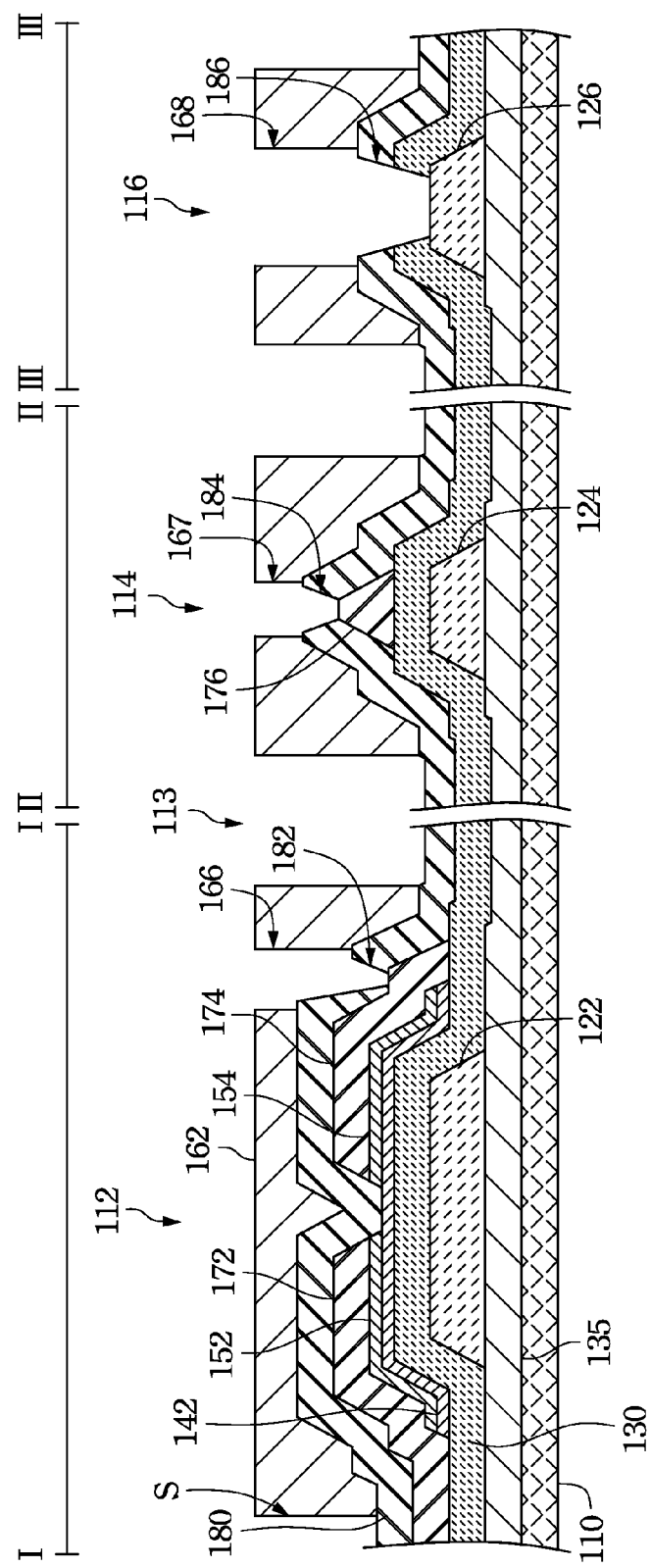

Reference is made to FIG. 42. The manufacturer may remove the thin mask layers 164 and simultaneously remove a thickness of the thick mask layers 162 to expose the passivation layer 180 above the transparent region 113. In the present embodiment, the thin mask layers 164 and the thickness of the thick mask layers 162 may be removed by an ashing process.

Figure 43:
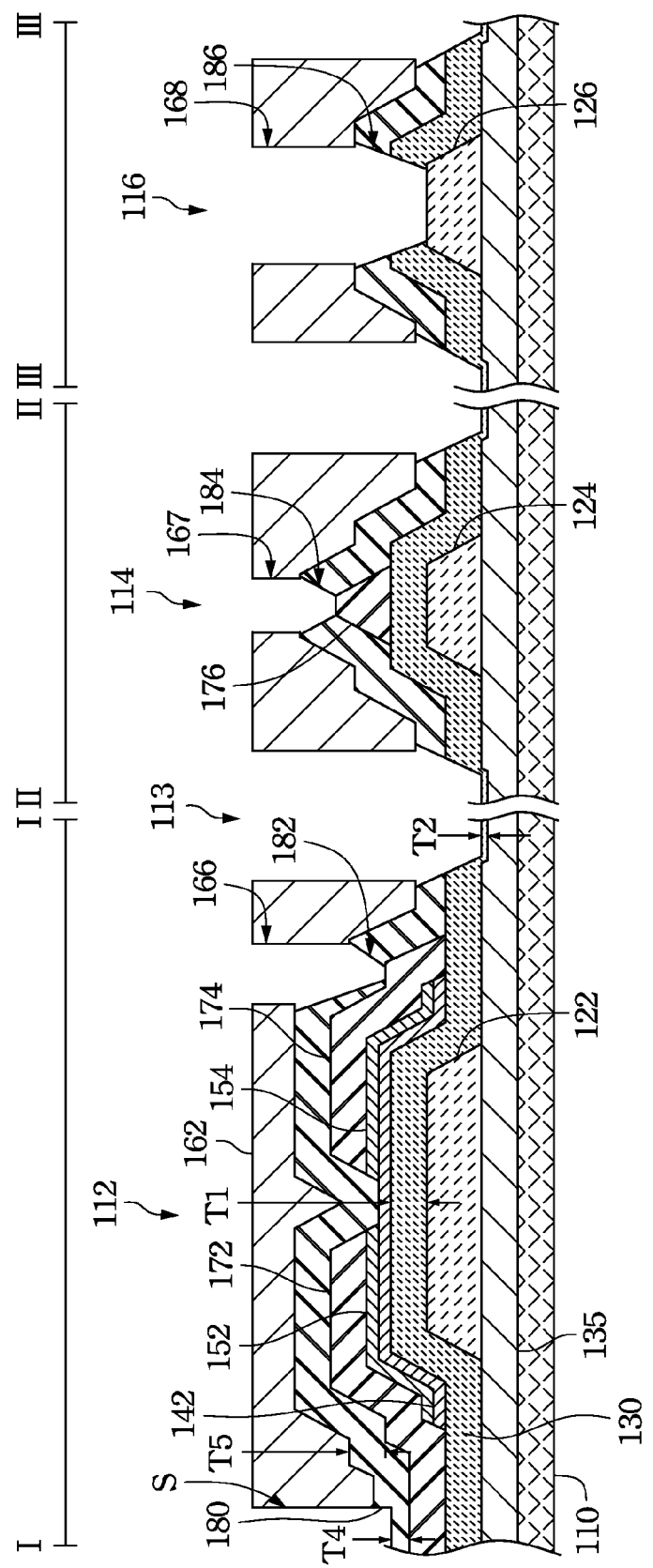

Reference is made to FIG. 43. The manufacturer may remove a part of the passivation layer 180 above the transparent region 113 and the dielectric layer 130 above the transparent layer 113 by the remaining patterned mask layer, i.e. the thick mask layers 162 after the thickness reduction, such that the portion of the dielectric layer 130 on the gate electrode 122 has a first thickness T1, and another portion of the dielectric layer 130 above the transparent region 113 of the flexible substrate 110 has a second thickness T2. The second thickness T2 is less than the first thickness T1. The ratio of the second thickness T2 to the first thickness T1 is 0.05-0.95, preferably 0.1-0.8, more preferably 0.3-0.6. In the present embodiment, the passivation layer 180 and the dielectric layer 130 may be removed by, for example, dry etching or wet etching.

It should be understood that although the half-tone mask process is used in the steps shown in FIG. 40 to FIG. 43 in the present embodiment for reducing the number of masks, this should not limit the scope of the claimed invention. The person having ordinary skill in the art may form the transistor contact hole 182, the capacitor contact hole 184, and the bonding pad contact hole 186 by a mask process and remove the part of the passivation layer 180 above the transparent region 113 and reduce the thickness of the portion of the dielectric layer 130 above the transparent layer 113 by another mask process if necessary.

Furthermore, a part of the passivation layer 180 above the edge of the transistor region 112 of the flexible substrate 110 may be hurt in the etching process since it is unavoidable that ashing the thick mask layers 162 and the thin mask layers 164 may cause the thick mask layers 162 shrink as indicated by the arrow S of FIG. 42. Therefore, the part of the passivation layer 180 above the edge of the transistor region 112 of the flexible substrate 110 has a fourth thickness T4, and the fourth thickness T4 is less than a thickness of a part of the passivation layer 180 above the center of the transistor region 112 of the flexible substrate 110, e.g. the fifth thickness T5. Moreover, in one or more embodiments, the metal oxide dielectric layer 135 may be hurt by the etching process, and thus the thickness of the metal oxide dielectric layer 135 may vary.

Reference is made to FIG. 44. The manufacturer may remove the remaining patterned mask layer, i.e. the thick mask layers 162 after the thickness reduction, by a stripper after the foregoing steps.

Reference is made to FIG. 45. The manufacturer may form a pixel electrode 192 on the portion of the dielectric layer 130 above the transparent region 113. The pixel electrode 192 may electrically connect the drain electrode 174 and the top electrode 176 through the transistor contact hole 182 and the capacitor contact hole 184. At the same time, the manufacturer may form a top bonding pad 194 on the bottom bonding pad 126. More specifically, the manufacturer may form a transparent conductive layer above the flexible substrate 110. The transparent conductive layer may cover all the structures on the flexible substrate 110. Then, the manufacturer may pattern the transparent conductive layer to form the pixel electrode 192 and the top bonding pad 194. In the present embodiment, the material of the transparent conductive layer, i.e. the pixel electrode 192 and the top bonding pad 194, may include indium tin oxide, indium zinc oxide, aluminum zinc oxide, or any combination thereof. The bottom bonding pad 126 and the top bonding pad 194 may constitute a bonding pad after the step shown in FIG. 45. The bonding pad is disposed above the bonding pad region 116 of the flexible substrate 110 to allow external circuits to be connected thereto.

In the fourth embodiment, the effect caused by the stress of the dielectric layer 130 created during the thermal processes is reduced since the second thickness T2 of the portion of the dielectric layer 130 above the transparent region 113 is thinner. Therefore, the deformations of the flexible substrate 110 and the glass substrate where the flexible substrate 110 is disposed are reduced. On the other hand, the metal oxide dielectric layer 135 disposed between the dielectric layer 130 and the flexible substrate 110 enhances the adhesion of the structure on the flexible substrate 110 to the flexible substrate 110. Therefore, the probability of peeling the structure on the flexible substrate 110 from the flexible substrate 110 during the manufacturing processes can be reduced. Moreover, sufficient protection can still be provided for the active device array substrate in this embodiment since the dielectric layer 130 is still above the transparent region 113. This can prevent the flexible substrate 110 from being damaged by the following semiconductor manufacturing processes and thus improves the surface roughness problem which may reduce the display quality. In addition, since the half-tone mask process is used in this embodiment to reduce the number of masks, the manufacturer may reduce the effect caused by the stress of the dielectric layer 130 without significantly increasing the manufacturing cost.

An active device array substrate with a flexible substrate is provided in the aforementioned embodiments of the present invention. The active device array substrate may be applied to various display panels, such as liquid crystal displays, organic light emitting diodes displays, electro-phoretic displays, and so on, such that the display panels can be flexible, and thus the application scope of the display panels can be extended.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. An active device array substrate comprising:
a flexible substrate having at least one transistor region and at least one transparent region adjacent to each other;
a gate electrode disposed on the transistor region of the flexible substrate;
a dielectric layer covering the gate electrode and the flexible substrate, a portion of the dielectric layer disposed on the gate electrode and having a first thickness, another portion of the dielectric layer disposed on the transparent region of the flexible substrate and having a second thickness, wherein the second thickness is less than the first thickness;
a channel layer, a source electrode, and a drain electrode disposed on the dielectric layer which is disposed on the transistor region, the channel layer disposed above the gate electrode, the source electrode and the drain electrode disposed on opposite sides of the channel layer and electrically connected to the channel layer; and
a pixel electrode disposed on the dielectric layer which is disposed on the transparent region, the pixel electrode electrically connected to the drain electrode, wherein said pixel electrode does not directly contact said flexible substrate.

2. The active device array substrate of claim 1, wherein a material of the flexible substrate comprises plastic.

3. The active device array substrate of claim 1, wherein a material of the flexible substrate comprises polyimide (PI), polyethylene terephthalate (PET), polyethylene naphthalate (PEN), or any combination thereof.

4. The active device array substrate of claim 1, wherein a material of the dielectric layer comprises silicon nitride ($SiN_x$), silicon oxide ($SiO_2$), silicon oxynitride ($SiO_xN_y$), or any combination thereof.

5. The active device array substrate of claim 1, further comprising at least one storage capacitor disposed on the flexible substrate, the storage capacitor comprising a bottom electrode, a capacitor dielectric layer, and a top electrode.

6. The active device array substrate of claim 5, wherein the capacitor dielectric layer is a part of the dielectric layer.

7. The active device array substrate of claim 1, further comprising at least one bonding pad disposed on the flexible substrate, the bonding pad comprising a bottom bonding pad and a top bonding pad.

8. The active device array substrate of claim 1, wherein a material of the channel layer comprises amorphous silicon, poly-silicon, oxide semiconductor, or any combination thereof.

9. The active device array substrate of claim 1, further comprising a passivation layer covering the channel layer, the source electrode, and the drain electrode.

10. The active device array substrate of claim 1, wherein a material of the pixel electrode comprises indium tin oxide, indium zinc oxide, aluminum zinc oxide, or any combination thereof.

11. The active device array substrate of claim 1, further comprising a metal oxide dielectric layer disposed between the flexible substrate and the dielectric layer.

12. The active device array substrate of claim 11, wherein the metal oxide dielectric layer is disposed between the flexible substrate and the gate electrode.

13. The active device array substrate of claim 11, wherein the metal oxide dielectric layer is disposed between the dielectric layer and the gate electrode.

14. The active device array substrate of claim 11, wherein a material of the metal oxide dielectric layer comprises indium oxide, zinc oxide, gallium oxide, or any combination thereof.

* * * * *